(12) United States Patent
Takeda et al.

(10) Patent No.: US 9,601,711 B2
(45) Date of Patent: Mar. 21, 2017

(54) COMPOSITION FOR FORMING TRANSPARENT ELECTRODE, TRANSPARENT ELECTRODE, ORGANIC ELECTRONIC ELEMENT, AND METHOD FOR MANUFACTURING TRANSPARENT ELECTRODE

(71) Applicant: Konica Minolta, Inc., Tokyo (JP)

(72) Inventors: Akihiko Takeda, Kanagawa (JP); Takatoshi Suematsu, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 20 days.

(21) Appl. No.: 14/377,785

(22) PCT Filed: Jan. 28, 2013

(86) PCT No.: PCT/JP2013/051725
§ 371 (c)(1),
(2) Date: Aug. 8, 2014

(87) PCT Pub. No.: WO2013/118599
PCT Pub. Date: Aug. 15, 2013

(65) Prior Publication Data
US 2015/0364713 A1  Dec. 17, 2015

(30) Foreign Application Priority Data
Feb. 10, 2012  (JP) ................. 2012-026766

(51) Int. Cl.
*H01L 51/52*  (2006.01)
*H01L 51/44*  (2006.01)
(Continued)

(52) U.S. Cl.
CPC .......... *H01L 51/5212* (2013.01); *C09D 11/10* (2013.01); *C09D 11/30* (2013.01);
(Continued)

(58) Field of Classification Search
CPC ...................... H01L 21/5203; H01L 1/52035
See application file for complete search history.

(56) References Cited

U.S. PATENT DOCUMENTS 6,280,799 B1 *  8/2001  Okabe .................... B05C 5/001
   427/261
7,655,161 B2 *  2/2010  Cho ...................... C09D 11/322
   252/512

(Continued)

FOREIGN PATENT DOCUMENTS

JP  2002-60662     2/2002
JP  2005-82613 A   3/2005
(Continued)

OTHER PUBLICATIONS

International Search Report for corresponding International Application No. PCT/JP2013/051725; mailed Mar. 12, 2013 (3 pages).
(Continued)

*Primary Examiner* — Yu-Hsi D Sun
(74) *Attorney, Agent, or Firm* — Osha Liang LLP

(57) ABSTRACT

A composition for forming a transparent electrode is to form a conductive polymer layer on a transparent substrate. The composition includes: a conductive polymer; a self-dispersing polymer dispersible in an aqueous solvent; water; a polar solvent other than water; and a glycol ether. The self-dispersing polymer is a self-dispersing polymer containing a dissociable group and having a glass transition temperature of 25° C. or more and 80° C. or less.

13 Claims, 5 Drawing Sheets

(51) Int. Cl.
*C09D 11/10* (2014.01)
*C09D 11/30* (2014.01)
*C09D 11/52* (2014.01)
*H01L 51/00* (2006.01)

(52) U.S. Cl.
CPC .......... *C09D 11/52* (2013.01); *H01L 51/0007* (2013.01); *H01L 51/0022* (2013.01); *H01L 51/445* (2013.01); *Y02E 10/549* (2013.01)

(56) References Cited

U.S. PATENT DOCUMENTS 7,896,721 B2 * 3/2011 Takei .................. H01L 27/3246
427/66
8,623,478 B2 * 1/2014 Koutake ............ H01L 51/0007
428/32.1

FOREIGN PATENT DOCUMENTS

| JP | 2005-302508 A | 10/2005 |
| JP | 2008-296380 A | 12/2008 |
| JP | 2009-4348 A | 1/2009 |
| JP | 2009-87843 A | 4/2009 |
| JP | 2010-106245 A | 5/2010 |
| JP | 2010-244746 A | 10/2010 |
| JP | 2011-26545 A | 2/2011 |
| JP | 2011-96437 A | 5/2011 |
| WO | 2011/099474 A | 8/2011 |

OTHER PUBLICATIONS

International Preliminary Report on Patentability issued in International Application No. PCT/JP2013/051725; mailed Aug. 21, 2014 (16 pages).

Office Action issued in corresponding Japanese Application No. 2013-557464, mailed Apr. 19, 2016 (15 pages).

* cited by examiner

COMPOSITION FOR FORMING TRANSPARENT ELECTRODE, TRANSPARENT ELECTRODE, ORGANIC ELECTRONIC ELEMENT, AND METHOD FOR MANUFACTURING TRANSPARENT ELECTRODE

TECHNICAL FIELD

Embodiments of the invention relate to a transparent electrode suitably used in various fields, such as liquid crystal display elements, organic luminescent elements, inorganic electroluminescent elements, solar batteries, electromagnetic shields, electronic paper and touch panels, and in particular relates to a composition for forming the transparent electrode.

BACKGROUND

With recent growing demand for flat-screen TVs, display technologies of various styles, including those making use of liquid crystal, plasma, organic electroluminescence and field emission, have been developed. For any of these displays of different styles, a transparent electrode is an essential technology. Besides televisions, a transparent electrode is indispensable for touch panels, mobile phones, electronic paper, various solar batteries and various diming electroluminescent elements.

A conventional transparent electrode having been most widely used is an ITO transparent electrode manufactured by forming an indium-tin composite oxide (ITO) film by vacuum deposition or sputtering on a transparent substrate composed of glass, a transparent plastic film or the like. However, it has been desired to disuse indium because indium is a rare metal and its price has been soaring. There also has been desired a production technology of roll-to-roll using a flexible substrate (flexible transparent substrate), such as a resin substrate, for larger screens of displays and for improvement in productivity.

In recent years, there has been developed a transparent conductive film (refer to Patent Documents 1 and 2, for example) composed of: a thin metal wire formed in a pattern; and a conductive polymer and the like stacked thereon, and having both current uniformity in surface and high conductivity so as to be suitable for products which are demanded to have a large area and low resistance. This structure, however, necessitates smoothening asperity of the thin metal wire using a conductive polymer or the like, the asperity being causative of leakage in an organic electronic device, and therefore it is essential to thicken the conductive polymer. A conductive polymer, however, shows absorption in the visible light region. Therefore, if the conductive polymer is thickened, transparency of the transparent electrode significantly decreases.

As a method to achieve both conductivity and transparency, there have been disclosed: a technology of stacking a conductive polymer on a thin-wire structure portion (refer to Patent Document 3, for example); a technology of applying a conductive polymer and a binder resin which is uniformly dispersible in an aqueous solvent onto a conductive fiber (refer to Patent Document 4, for example); and a technology of stacking a conductive polymer and a binder on a conductive layer (refer to Patent Document 5, for example). However, even these technologies cannot achieve sufficient sheet resistivity and transmittance and accordingly have a problem in achievement of both conductivity and transparency.

By the way, when mass production of transparent electrodes is carried out by roll-to-roll using a flexible transparent substrate, such as a resin substrate, as a substrate of each transparent electrode, it is preferable to adopt "inkjet printing" as a method for forming a layer containing a conductive polymer in terms of a patterning property of the conductive layer, productivity and the like.

Meanwhile, in any of the technologies of Patent Documents 1 to 5, no consideration is given to problems of inkjet printing, such as clogging of a head, insufficient wettability of an ink to the substrate and insufficient dispersion stability of an ink over time. Further, for example, in the technology of Patent Document 4, the conductive polymer layer is formed by spin coating. Still further, in the technology of Patent Document 5, although drying at high temperature for a long time is necessary to sufficiently advance a polymer crosslinking reaction, this increases the process load and also disallows use of a resin substrate and a polymer each having a low glass transition temperature as materials for the transparent substrate and the conductive polymer layer, respectively, which is unsuitable for mass production of transparent electrodes by roll-to-roll.

Further, as described, for example, in Patent Documents 4 and 5, there has been developed, as a specific composition (application liquid) for forming a transparent electrode (conductive polymer layer), the composition containing a water-dispersible conductive polymer, such as 3,4-polyethylene dioxythiophene polysulfonate (PEDOT/PSS), and a binder resin in order to achieve both conductivity and transmittance. In particular, a hydrophilic binder resin has been investigated as a binder resin in terms of compatibility with a water-dispersible conductive polymer.

RELATED ART DOCUMENTS

Patent Documents

Patent Document 1: Japanese Patent Application Laid-Open Publication No. 2005-302508
Patent Document 2: Japanese Patent Application Laid-Open Publication No. 2009-87843
Patent Document 3: Japanese Patent Application Laid-Open Publication No. 2009-4348
Patent Document 4: Japanese Patent Application Laid-Open Publication No. 2010-244746
Patent Document 5: Japanese Patent Application Laid-Open Publication No. 2011-96437

SUMMARY OF THE INVENTION

However, as described above, the demand for flexibility of a transparent electrode has been growing. For that, if a resin film such as polyethylene terephthalate is used, a drying temperature thereof needs to be lower than that of a glass substrate in order to avoid film deformation. Further, a hydroxyl group-containing binder, which is known to be compatible with PEDOT/PSS, allows a hydroxyl-group dehydration reaction under an acidic condition, thereby crosslinking polymer chains, but causes poor crosslinking by being dried at a low temperature, which results in that the crosslinking reaction proceeds and water is generated during storage, and also performance of the transparent electrode and performance of an element using the transparent electrode significantly degrade by influence of water remaining in the film.

It is necessary to reduce interaction between the principal skeleton of a binder and water and also to reduce the number of hydroxyl groups in the binder resin or to eliminate them. Use of a dispersion liquid in which a hydrophobic polymer is uniformly dispersed in an aqueous solvent using a surfactant has a possibility that in the transparent electrode and an element using the transparent electrode, performance of the electrode and/or performance of the element degrade.

Therefore, embodiments of the claimed invention provide a composition for forming a transparent electrode (conductive polymer layer), the composition being optimum for inkjet printing and suitable for mass production and capable of preventing performance of a transparent electrode and/or performance of an organic electronic element from degrading when the composition is used in manufacturing the electrode or the element.

The present inventors have earnestly investigated into improvement in these phenomena and reached the structure of the present invention, which is use of a self-dispersing polymer (dissociable group-containing self-dispersing polymer) as a binder resin, the self-dispersing polymer being dispersible in an aqueous solvent, containing a dissociable group and having a glass transition temperature of 25° C. or more and 80° C. or less.

That is, embodiments of the invention have been reached by having been found out that the above problems can be solved by containing the dissociable group-containing self-dispersing polymer in the present invention as a binder resin to be mixed with a conductive polymer.

A method for forming a transparent electrode using an application liquid containing the water-dispersible conductive polymer and the binder resin is exemplified by relief printing, intaglio printing, screen printing and inkjet printing in accordance with one or embodiments of the invention. Inkjet printing is the most preferable in terms of transparency and conductivity of a transparent electrode, suitability for patterning of a conductive layer and productivity. However, inkjet printing is a method of discharging liquid droplets from a head composed of a large number of small-opening nozzles, and therefore, in the case of a dispersible liquid, may cause poor discharge by the nozzles being clogged with the dispersed particles. For stable discharge, it is essential to use a stable liquid composition which is neither coagulated nor increases its viscosity over time.

The present inventors have given consideration to these problems and achieved improvement in stability of a discharge substance over time and discharge stability thereof in inkjet printing using a composition composed of a water-dispersible conductive polymer, a dissociable group-containing self-dispersing polymer, water, a polar solvent other than water and a glycol ether.

Embodiments of the invention can provide a transparent electrode which has both transparency and conductivity and little degradation of the transparency and conductivity at high temperature and high humidity by using a self-dispersing polymer as a binder resin, the self-dispersing polymer being dispersible in an aqueous solvent, containing a dissociable group and having a glass transition temperature of 25° C. or more and 80° C. or less. Further, it has been found out that an organic EL element having high emission uniformity, high stability of performance at high temperature and high humidity, and a long lifetime can be obtained by using this transparent electrode, which prevents water originated from the binder resin from being generated.

Further, it has been found out that when the composition, which has a conductive polymer and a dissociable group-containing self-dispersing polymer to form a conductive polymer layer, contains a polar solvent and a glycol ether, high stability of a composition itself over time and high discharge stability thereof in inkjet printing can be obtained.

That is, according to one or more embodiments of the invention, there is provided a composition for forming a transparent electrode to form a conductive polymer layer on a transparent substrate, the composition containing: a conductive polymer; a self-dispersing polymer dispersible in an aqueous solvent; water; a polar solvent other than water; and a glycol ether, wherein the self-dispersing polymer is a self-dispersing polymer containing a dissociable group and having a glass transition temperature of 25° C. or more and 80° C. or less.

Embodiments of the invention are optimum for inkjet printing and suitable for mass production and can prevent performance of a transparent electrode and/or performance of an organic electronic element from degrading when it is used in manufacturing the electrode or the element.

DETAILED DESCRIPTION

Hereinafter, a preferred embodiment of the present invention is described with reference to the drawings.

<<Transparent Electrode (1)>>

Figure 1:
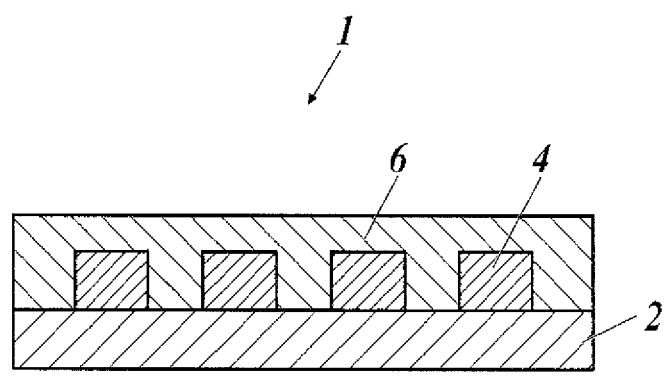
FIG. 1 is a cross-sectional view showing a schematic structure of a transparent electrode in accordance with one or more embodiments of the invention.

As shown in FIG. 1, a transparent electrode 1 is mainly composed of a transparent substrate 2, a conductive metal layer 4 and a conductive polymer layer 6.

Figure 2A:
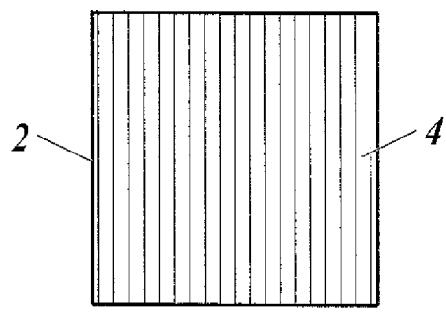
FIG. 2A is a plan view showing an example of a pattern of a conductive metal layer of the transparent electrode in accordance with one or more embodiments of the invention.
Figure 2B:
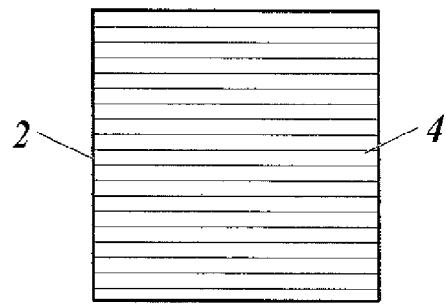
FIG. 2B is a plan view showing a modification of FIG. 2A in accordance with one or more embodiments of the invention.
Figure 2C:
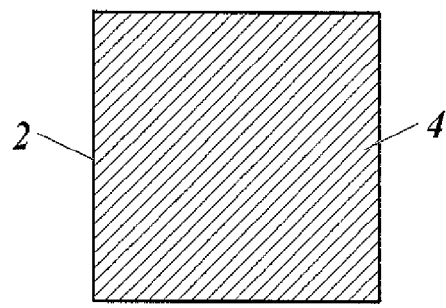
FIG. 2C is a plan view showing a modification of FIG. 2A in accordance with one or more embodiments of the invention.
Figure 2D:
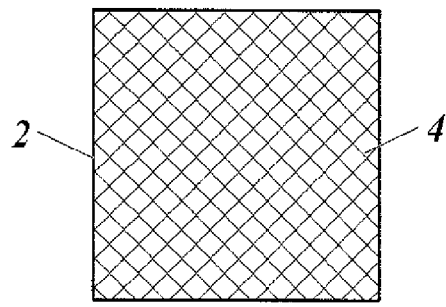
FIG. 2D is a plan view showing a modification of FIG. 2A in accordance with one or more embodiments of the invention.

On the transparent substrate 2, the conductive metal layer 4 composed of a metal material and having a thin wire pattern is formed. In the conductive metal layer 4, a thin wire composed of metal particles may be formed to be striped as shown in FIGS. 2A to 2C or may be formed to be meshed (a network) as shown in FIG. 2D.

On the conductive metal layer 4, the conductive polymer layer 6 composed of a conductive polymer is formed. The conductive polymer layer 6 is uniformly formed and covers the front side of the conductive metal layer 4 and the front side of the transparent substrate 2 exposed from the conductive metal layer 4.

<<Transparent Substrate (2)>>

A transparent substrate is a sheet-type article capable of holding thereon conductive layers. In order to obtain a transparent electrode, the transparent substrate used by preference has a total luminous transmittance in the visible light wavelength region of 80% or more determined by a method in conformity with JIS K 7361-1:1997 (Plastics—Determination of the Total Luminous Transmittance of Transparent Materials).

As the transparent substrate, a transparent glass substrate can be used, and also one composed of a material having excellent flexibility and a sufficiently small dielectric loss coefficient and absorbing microwaves less than conductive layers do is preferably used.

Preferable examples of the transparent substrate include a resin substrate and a resin film. It is preferable to use a transparent resin film in terms of productivity and properties such as lightness in weight and flexibility. The transparent resin film is one having a total luminous transmittance in the visible light wavelength region of 50% or more determined by a method in conformity with JIS K 7361-1: 1997 (Plastics—Determination of the Total Luminous Transmittance of Transparent Materials).

Embodiments of the invention using a dissociative group-containing self-dispersing polymer (described below) in a conductive polymer layer enables treatment to be done at a lower temperature within a shorter time than a conventional technology does and can use a general-purpose transparent resin film having a low glass transition temperature.

The transparent resin film usable by preference is not particularly limited, and its material, shape, structure, thickness and the like are suitably selectable from publicly known ones.

Examples thereof include polyester resin films such as polyethylene terephthalate (PET), polyethylene naphthalate and modified polyester; polyolefin resin films such as a polyethylene (PE) resin film, a polypropylene (PP) resin film, a polystyrene resin film and cyclic olefin resins; vinyl resin films such as polyvinyl chloride and polyvinylidene chloride; a polyether ether ketone (PEEK) resin film; a polysulfone (PSF) resin film; a polyethersulfone (PES) resin film; a polycarbonate (PC) resin film; a polyamide resin film; a polyimide resin film; an acryl resin film; and a triacetylcellulose (TAC) resin film.

Any of the resin films having a total luminous transmittance of 80% or more is preferably used as the film substrate used in one or more embodiments of the invention. Among them, in terms of transparency, heat resistance, handleability, strength and costs, a biaxially oriented polyethylene terephthalate film, a biaxially oriented polyethylene naphthalate film, a polyethersulfone film and a polycarbonate film are preferable, and a biaxially oriented polyethylene terephthalate film and a biaxially oriented polyethylene naphthalate film are far preferable.

The transparent substrate used in one or more embodiments of the invention can be surface-treated or provided with an easy adhesion layer in order to ensure wettability and adhesiveness of an application liquid. Publicly known technologies are usable for the surface treatment and the easy adhesion layer.

Examples of the surface treatment include surface activation treatment such as corona discharge treatment, flame treatment, ultraviolet treatment, high frequency treatment, glow discharge treatment, activated plasma treatment and laser treatment.

Examples of the easy adhesion layer include polyester, polyamide, polyurethane, vinyl copolymers, butadiene copolymers, acryl copolymers, vinylidene copolymers and epoxy copolymers. The easy adhesion layer may be composed of a single layer or, in order to improve adhesiveness, may be composed of two or more layers.

On the front side or the back side of the film substrate, a coating composed of an inorganic matter or an organic matter or a hybrid coating composed of these may be formed, preferably a barrier film having a water vapor permeability (at 25±0.5° C. and a relative humidity of (90±2)% RH) of $1\times10^{-3}$ g/(m$^2$·24 h) or less determined by a method in conformity with JIS K 7129-1992, and far preferably a high-barrier film having an oxygen permeability of $1\times10^{-3}$ ml/m$^2$·24 h·atm or less determined by a method in conformity with JIS K 7126-1987 and a water vapor permeability (at 25±0.5° C. and a relative humidity of (90±2)% RH) of $1\times10^{-3}$ g/(m$^2$·24 h) or less.

As a material which forms the barrier film to be formed on the front side or the back side of the film substrate so as to be a high-barrier film, any material is used as long as it is impermeable to substances such as moisture and oxygen which cause degradation of an element. Usable examples thereof include silicon oxide, silicon dioxide and silicon nitride. In order to reduce fragility of the film, it is far preferable that the film have a multilayer structure of an inorganic layer and a layer composed of an organic material. Although the stacking order of the inorganic layer and the organic layer is not particularly limited, it is preferable that these be alternately stacked multiple times.

<<Conductive Metal Layer (4)>>

As described above, a conductive metal layer is a layer composed of a metal material and takes on a certain pattern.

The metal material is not particularly limited as long as it has conductivity. Examples thereof include metals, such as gold, silver, copper, iron, cobalt, nickel and chromium, and alloys.

In particular, in terms of easiness in pattern formation as described below, the form of the metal material is preferably fine metal particles or metal nanowires, and, in terms of conductivity, the metal material is preferably silver or copper and far preferably silver.

The conductive metal layer is formed in a pattern having an open part on the transparent substrate so as to form a transparent electrode. The open part is a part having no metal material on the transparent substrate and serves as a translucent window.

The pattern is not particularly limited and therefore a conductive part may be striped (FIGS. 2A to 2C), latticed (FIG. 2D) or a random network, but an open area ratio is preferably 80% or more in terms of transparency.

The open area ratio is a ratio of the optically nontransparent conductive part to the whole. For example, in the case where the conductive part is striped or meshed, the open area ratio of a stripe pattern having a wire width of 100 μm and a wire interval of 1 mm is approximately 90%.

The wire width of the pattern is preferably 10 to 200 μm. If the wire width of the thin wire is less than 10 μm, a desired level of conductivity cannot be obtained, whereas if the wire width thereof is more than 200 μm, transparency decreases. The height of the thin wire is preferably 0.1 to 10 μm. When the height of the thin wire is 0.1 μm or more, a desired level of conductivity is easily obtained, whereas when the height thereof is 10 μm or less, current leakage and distribution of thickness of a functional layer in forming an organic electronic device are favorable, which is preferable.

A method for forming an electrode having the stripe or mesh conductive part is not particularly limited, and therefore a publicly known method can be used therefor.

For example, an electrode can be formed by forming a metal layer over the entire surface of the transparent substrate and subjecting it to photolithography, which is publicly known. More specifically, after (i) a conductive layer is formed over the entire surface of the front side of the transparent substrate by one or two or more physically- or chemically-forming methods such as printing, vapor deposition, sputtering and plating, or after (ii) a metal foil is stacked on the transparent substrate with an adhesive, it is etched by the publicly known photolithography, thereby being processed to be striped or meshed which is desired.

Other usable methods include printing in a desired pattern, such as relief printing, intaglio printing, screen printing or inkjet printing, using an ink containing fine metal particles; application in a desired pattern by relief printing, intaglio printing, screen printing or inkjet printing, using a catalyst ink capable of being plated, followed by plating; and a method making use of a silver halide photographic technology. The method making use of a silver halide photographic technology can be implemented, for example, with reference to Paragraphs [0076] to [0112] and Examples of Japanese Patent Application Laid-Open Publication No. 2009-140750. The method of gravure printing with a catalyst ink followed by plating can be implemented, for example, with reference to Japanese Patent Application Laid-Open Publication No. 2007-281290.

The random network structure can be formed, for example, by a method described in Published Japanese Translation of PCT International Publication for Patent Application No. 2005-530005, according to which a disordered network structure of conductive fine particles is spontaneously formed by applying and drying a liquid containing fine metal particles.

Another usable method is described, for example, in Published Japanese Translation of PCT International Publication for Patent Application No. 2009-505358, according to which a random network structure of metal nanowires is formed by applying and drying an application liquid containing metal nanowires.

The metal nanowires are fibrous structures mainly composed of a metal element. In particular, the metal nanowire (s) of the present invention mean a large number of fibrous structures having minor axes ranging from the atomic scale to nanometer scale.

The metal nanowires preferably have an average length of 3 μm or more in order to form a long conductive path with a single metal nanowire, far preferably 3 to 500 μm and particularly preferably 3 to 300 μm. In addition, the relative standard deviation of the lengths thereof is preferably 40% or less. The average minor axis is not particularly limited, but preferably small in terms of transparency whereas preferably large in terms of conductivity. The average minor axis of the metal nanowires is preferably 10 to 300 nm and far preferably 30 to 200 nm. In addition, the relative standard deviation of the minor axes thereof is preferably 20% or less. The weight per unit area of the metal nanowires is preferably 0.005 to 0.5 g/m$^2$ and far preferably 0.01 to 0.2 g/m$^2$.

Metals usable for the metal nanowires include copper, iron, cobalt, gold and silver. Among them, silver is preferable in terms of conductivity. One type of metal may be used alone, or, in order to obtain both conductivity and stability (sulfation resistance, oxidation resistance and migration resistance of the metal nanowires), one type of metal as a main component may be combined with one or more other types of metal at an arbitrary ratio.

A method for manufacturing the metal nanowires is not particularly limited, and, for example, a publicly known method such as a liquid-phase method or a vapor-phase method can be used therefor. Its specific manufacturing method is not particularly limited either, and a publicly known manufacturing method can be used therefor.

For example, reference can be made to: Adv. Mater., 2002, Vol. 14, pp. 833-837 and Chem. Mater., 2002, Vol. 14, pp. 4736-4745 for methods for manufacturing silver nanowires; Japanese Patent Application laid-Open Publication No. 2006-233252 and so forth for methods for manufacturing gold nanowires; Japanese Patent Application Laid-Open Publication No. 2002-266007 and so forth for methods for manufacturing copper nanowires; and Japanese Patent Application Laid-Open Publication No. 2004-149871 and so forth for methods for manufacturing cobalt nanowires. In particular, the above mentioned methods for manufacturing silver nanowires can be preferably used because silver nanowires can be simply and easily manufactured in an aqueous solution and also because silver has the highest conductivity among metals.

Surface resistivity of the thin-wire part composed of the metal material is preferably 100Ω/□ or less and, for the larger ones, far preferably 20Ω/□ or less. The surface resistivity is measurable, for example, in conformity with JIS K6911, ASTM D257 or the like and is simply and easily measurable with a commercially available surface resistivity meter.

It is preferable to carry out heat treatment on the thin-wire part composed of the metal material within an extent of not damaging the film substrate. This is particularly preferable because the fine metal particles or the metal nanowires are well fused with each other thereby, and conductivity of the thin-wire part composed of the metal material increases.

<<Conductive Polymer Layer (6)>>

A conductive polymer layer is composed of a composition containing: a conductive polymer; and a self-dispersing polymer being dispersible in an aqueous solvent, containing a dissociable group and having a glass transition temperature of 25° C. or more and 80° C. or less.

Consequently, the obtained transparent electrode has both high transparency and high conductivity and little changes its properties at high temperature and high humidity.

The conductive polymer layer is stacked on the conductive metal layer composed of the thin metal wire so as to form a transparent electrode with the conductive metal layer. Consequently, the transparent electrode can have both high transparency and high conductivity and also can obtain uniformity in the electrode surface.

To be more specific, the conductive polymer layer is composed of the composition containing water, a polar solvent and a glycol ether in addition to the conductive polymer and the self-dispersing polymer and formed by printing the composition as a discharge liquid by inkjet printing. Consequently, the composition can be printed on the substrate at an amount necessary and sufficient to obtain high transparency and high conductively. In particular, when the conductive polymer layer is stacked on the conductive metal layer, printing can be carried out with high patterning accuracy.

The composition for forming the conductive polymer layer is detailed.

(1) Conductive Polymer

In the present invention, the "conductive" means a state that electricity flows and means that sheet resistivity measured by a method in conformity with JIS K 7194, "Testing Method for Resistivity of Conductive Plastics with a Four-Point Probe Array", is less than $10 \times {}^8\Omega/\square$.

The conductive polymer of the present invention is a conductive polymer having a π-conjugated conductive polymer and a polyanion. This sort of conductive polymer can be easily manufactured by subjecting a precursor monomer, described below, for forming the π-conjugated conductive polymer to chemical oxidative polymerization under the presence of an appropriate oxidizer, an appropriate oxidation catalyst and the polyanion described below.

(1.1) π-Conjugated Conductive Polymer

The π-conjugated conductive polymer used in the present invention is not particularly limited, and usable examples thereof include chain conductive polymers such as polythiophenes (including simple polythiophene, the same applies to the following), polypyrrols, polyindoles, polycarbazoles, polyanilines, polyacetylenes, polyfurans, polyparaphenylene vinylenes, polyazulenes, polyparaphenylenes, polyparaphenylene sulfides, polyisothianaphthenes and polythiazyls. Among them, in terms of conductivity, transparency, stability and the like, polythiophenes and polyanilines are preferable, and polyethylene dioxythiophene is the most preferable.

(1.1.1) Precursor Monomer for π-Conjugated Conductive Polymer

The precursor monomer used for forming the π-conjugated conductive polymer has a π-conjugated system in the molecule, and hence when the precursor monomer is polymerized by the action of an appropriate oxidizer, the π-conjugated system is formed in the principal chain. Examples thereof include pyrroles and derivatives thereof, thiophenes and derivatives thereof, and anilines and derivatives thereof.

Specific examples of the precursor monomer include pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxylpyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylene dioxythiophene, 3,4-propylene dioxythiophene, 3,4-butene dioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, aniline, 2-methylaniline, 3-isobutylaniline, 2-aniline sulfonic acid and 3-aniline sulfonic acid.

(1.2) Polyanion

The polyanion used for the conductive polymer in one or more embodiments of the invention is exemplified by: substituted or non-substituted polyalkylene; substituted or non-substituted polyalkenylene; substituted or non-substituted polyimide; substituted or non-substituted polyamide; substituted or non-substituted polyester; and copolymers thereof, and is composed of a constituent having an anionic group and a constituent having no anionic group.

The polyanion is a solubilizing polymer to solubilize the π-conjugated conductive polymer in a solvent. The anionic group of the polyanion functions as a dopant for the π-conjugated conductive polymer and improves conductivity and heat resistance of the π-conjugated conductive polymer.

The anionic group of the polyanion is any functional group with which the π-conjugated conductive polymer can be doped by chemical oxidation. In particular, a monosubstituted sulfuric acid ester group, a monosubstituted phosphoric acid ester group, a phosphoric acid group, a carboxyl group, a sulfo group and the like are preferable in terms of easiness in manufacturing and stability. The sulfo group, the monosubstituted sulfuric acid ester group and the carboxyl group are far preferable in terms of the doping effect of the functional group on the π-conjugated conductive polymer.

Specific examples of the polyanion include polyvinylsulfonic acid, polystyrenesulfonic acid, polyallylsulfonic acid, polyacrylic acid ethylsulfonic acid, polyacrylic acid butylsulfonic acid, poly-2-acrylamide-2-methylpropanesulfonic acid, polyisoprenesulfonic acid, polyvinylcarboxylic acid, polystyrenecarboxylic acid, polyallylcarboxylic acid, polyacrylcarboxylic acid, polymethacrylcarboxylic acid, poly-2-acrylamide-2-methylpropanecarboxylic acid, polyisoprenecarboxylic acid and polyacrylic acid. The polyanion may be a homopolymer of any of these or a copolymer composed of two or more types of these.

The polyanion may further contain F (fluorine atom) in the compound. Specific examples thereof include Nation (manufactured by DuPont K.K.) containing a perfluorosulfonic acid group and Flemion (manufactured by Asahi Glass Co., Ltd.) composed of a perfluorovinyl ether containing a carboxylic acid group. These fluorinated polyanions can be each used in combination with any of the above mentioned non-fluorinated polyanions, thereby forming a transparent electrode to which a positive hole injection function is added, which is desired in terms of element efficiency and productivity.

If, among them, the compound is the one having sulfonic acid, after being formed by applying and drying an application liquid but before being irradiated with microwaves, the conductive polymer layer may be dried by heating at 100 to 120° C. for five minutes or more. This is preferable because the crosslinking reaction proceeds thereby, so that cleaning resistance and solvent resistance of the coated film are significantly improved.

Among the above mentioned ones, polystyrenesulfonic acid, polyisoprenesulfonic acid, polyacrylic acid ethylsulfonic acid, and polyacrylic acid butylsulfonic acid are preferable. These polyanions each have high compatibility with a nonconductive polymer containing a hydroxyl group and can further increase conductivity of the conductive polymer to be obtained.

Degree of polymerization of the polyanion is preferably in a range of 10 to 100,000 in the number of monomer units and, in terms of solubility in a solvent and conductivity, far preferably in a range of 50 to 10,000 in the number of monomer units.

A method for manufacturing the polyanion is exemplified by: a method of, using acid, direct introduction of an anionic group into a polymer having no anionic group; a method of, using a sulfonating agent, sulfonation of a polymer having no anionic group; and a method of polymerization of an anionic group-containing polymerizable monomer.

The method of polymerization of an anionic group-containing polymerizable monomer is exemplified by a method of subjecting, in a solvent, an anionic group-containing polymerizable monomer to oxidative polymerization or radical polymerization under the presence of an oxidizer and/or a polymerization catalyst. More specifically, a predetermined amount of an anionic group-containing polymerizable monomer is dissolved into a solvent, the resulting product is kept at a constant temperature, and a solution in which a predetermined amount of an oxidizer and/or a polymerization catalyst is dissolved into a solvent in advance is added thereto and reacts therewith for a predetermined time. The polymer obtained by the reaction is adjusted to a certain concentration using a solvent. In this manufacturing method, the anionic group-containing polymerizable monomer may be copolymerized with a polymerizable monomer containing no anionic group.

The oxidizer, oxidizing catalyst and solvent used in polymerization of the anionic group-containing polymerizable monomer are the same as those used in polymerization of the precursor monomer for forming the π-conjugated conductive polymer.

If the obtained polymer is polyanionic salt, it is preferable to change polyanionic salt to polyanionic acid. A method for changing polyanionic salt to polyanionic acid is exemplified by: ion exchange using an ion exchange resin; dialysis; and ultrafiltration. Among them, ultrafiltration is preferable in terms of easiness in work.

A ratio of the π-conjugated conductive polymer to the polyanion contained in the conductive polymer, namely, "π-conjugated conductive polymer":"polyanion", by mass ratio is preferably in a range of 1:1 to 1:20 and, in terms of conductivity and dispersibility, far preferably in a range of 1:2 to 1:10.

The oxidizer, which is used in subjecting the precursor monomer for forming the π-conjugated conductive polymer to chemical oxidative polymerization under the presence of the polyanion so as to obtain the conductive polymer in accordance with one or more embodiments of the invention, is any of oxidizers suitable for oxidative polymerization of pyrrole, the oxidizers being mentioned, for example, in J. Am. Soc., Vol. 85, p. 454 (1963). For practical reasons, it is preferable to use an inexpensive and easily handleable oxidizer, and examples thereof include: iron (III) salts, such as $FeCl_3$, $Fe(ClO_4)_3$, and iron (III) salt of organic acid or inorganic acid containing organic residue; hydrogen peroxide; potassium dichromate; alkali persulfate (potassium persulfate and sodium persulfate, for example); ammonium; alkali perborate; potassium permanganate; and copper salt, such as copper tetrafluoroborate. In addition, air and oxygen under the presence of a catalytic amount of metal ion, such as iron ion, cobalt ion, nickel ion, molybdenum ion or vanadium ion, can be used as the oxidizer as needed. Use of persulfate or iron (III) salt of organic acid or inorganic acid containing organic residue has a great practical advantage because of the non-corrosiveness.

Examples of the iron (III) salt of inorganic acid containing organic residue include: iron (III) salts, namely, Fe (III) salts, of alkanol sulfuric acid half-ester having 1 to 20 carbon atoms, such as lauryl sulfate; alkylsulfonic acid having 1 to 20 carbon atoms, such as methane- or dodecanesulfonic acid; aliphatic carboxylic acid having 1 to 20 carbon atoms, such as 2-ethylhexylcarboxylic acid; aliphatic perfluorocarboxylic acid, such as trifluoroacetic acid and perfluorooctanoic acid; aliphatic dicarboxylic acid, such as oxalic acid; and in particular, alkyl, as needed, substituted aromatic sulfonic acid having 1 to 20 carbon atoms, such as benzenesulfonic acid, p-toluenesulfonic acid and dodecylbenzene sulfonic acid.

For this sort of conductive polymer, a commercially available material can also be preferably used.

For example, a conductive polymer (abbreviated as PEDOT-PSS) composed of poly(3,4-ethylene dioxythiophene) and polystyrenesulfonic acid is commercially available from H.C. Starck GmbH as Clevios Series, from Aldrich as PEDOT-PSS 483095 and 560596, and from Nagase ChemteX Corporation as Denatron Series. In addition, polyaniline is commercially available from Nissan Chemical Industries, Ltd. as ORMECON Series. Any of these agents can also be preferably used in the present invention.

(2) Dissociable Group-Containing Self-Dispersing Polymer

As a constituent material for the conductive polymer layer, a binder resin is used in addition to the above described conductive polymer in accordance with one or more embodiments of the invention. The binder resin to be used is a self-dispersing polymer being dispersible in an aqueous solvent, containing a dissociable group and having a glass transition temperature of 25° C. or more and 80° C. or less.

The dissociable group-containing self-dispersing polymer dispersible in an aqueous solvent does not contain a surfactant, an emulsifier and the like which assist micelle formation, but is dispersible by itself in an aqueous solvent. The "dispersible in an aqueous solvent" means that colloidal particles composed of the binder resin are dispersed in an aqueous solvent without being coagulated.

The size of the colloidal particles is around 0.001 to 1 μm (1 to 1000 μm) in general. The size of the colloidal particles is preferably 3 to 500 nm, far preferably 5 to 300 nm and still far preferably 10 to 100 μm. With respect to the above mentioned colloidal particles, the measurement can be carried out with a light scattering photometer.

The "aqueous solvent" means not only pure water (including distilled water and deionized water) but also an aqueous solution containing acid, alkali, salt or the like; a water-containing organic solvent; and a hydrophilic organic solvent. Examples thereof include pure water (including distilled water and deionized water); alcoholic solvents such as methanol and ethanol; and a mixed solvent of water and alcohol.

The dissociable group-containing self-dispersing polymer of one or more embodiments of the invention is preferably transparent.

The dissociable group-containing self-dispersing polymer is not particularly limited as long as it is a medium which forms a film. A dispersion liquid of the polymer is not particularly limited as long as it does not bleed out to the transparent electrode surface and does not cause any problems in performance of an organic EL element when the element is stacked, but preferably does not contain, for example, a surfactant (emulsifier) and a plasticizer which controls a film forming temperature.

pH of the dispersion liquid of the dissociable group-containing self-dispersing polymer used for manufacturing a transparent electrode is desired to be in a range in which the dispersion liquid does not separate from the conductive polymer solution, which is mixed with the dispersion liquid separately, preferably in a range of 0.1 to 11.0, far preferably in a range of 3.0 to 9.0 and still far preferably in a range of 4.0 to 7.0.

The glass transition temperature (Tg) of the dissociable group-containing self-dispersing polymer of the present embodiment is 25° C. or more and 80° C. or less, preferably 30 to 75° C. and far preferably 50 to 70° C.

The glass transition temperature being less than 25° C. not only fails to obtain surface smoothness of a transparent electrode owing to a poor film formation property of the coated film but also degrades performance of an organic EL element owing to deformation of the coated film under an environmental test of the transparent electrode and the organic EL element carried out at high temperature. On the other hand, the glass transition temperature being more than 80° C. degrades performance of the element owing to decrease in homogeneity and surface smoothness of the conductive polymer layer, which is composed of the conductive polymer and the self-dispersing polymer.

The glass transition temperature is measurable at a temperature rise rate of 10° C./min with a differential scanning calorimeter (Model DSC-7 manufactured by PerkinElmer Inc.) in conformity with JIS K7121 (1987).

Examples of the dissociable group used for the dissociable group-containing self-dispersing polymer include an anionic group (sulfonic acid and salt thereof, carboxylic acid and salt thereof, phosphoric acid and salt thereof, etc.) and a cationic group (ammonium salt, etc.). Although not particularly limited, the dissociable group is preferably an anionic group in terms of compatibility with the conductive polymer solution.

The amount of the dissociable group may be any as long as the self-dispersing polymer is dispersible in an aqueous solvent, preferably an amount as small as possible in terms of process adequacy so that a drying load is reduced. A counter species used for an anionic group or a cationic group is not particularly limited, but it is preferably hydrophobic and exists at a small amount in terms of performance of a transparent electrode or an organic EL element when the transparent electrode or the organic EL element is stacked.

Examples of the principal skeleton of the dissociable group-containing self-dispersing polymer include polyethylene, polyethylene-polyvinyl alcohol (PVA), polyethylene-polyvinyl acetate, polyethylene-polyurethane, polybutadiene, polybutadiene-polystyrene, polyimide (nylon), polyvinylidene chloride, polyester, polyacrylate, polyacrylate-polyester, polyacrylate-polystyrene, polyvinyl acetate, polyurethane-polycarbonate, polyurethane-polyether, polyurethane-polyester, polyurethane-polyacrylate, silicone, silicone-polyurethane, silicone-polyacrylate, polyvinylidene fluoride-polyacrylate and polyfluoroolefin-polyvinyl ether. Copolymers using other monomers with these skeletons as bases may also be used. Among them, a polyester resin emulsion and a polyester-acryl resin emulsion each having the ester skeleton and a polyethylene resin emulsion having the ethylene skeleton are preferable.

Usable commercially-available products thereof include Polysol FP3000 (polyester resin, anionic, acrylic core, polyester shell, manufactured by Showa Denko K.K.), Vylonal MD 1245 (polyester resin, anionic, manufactured by Toyobo Co., Ltd.), Vylonal MD 1500 (polyester resin, anionic, manufactured by Toyobo Co., Ltd.), Vylonal MD2000 (polyester resin, anionic, manufactured by Toyobo Co., Ltd.), PLAS COAT RZ105 (polyester resin, anionic, manufactured by Goo Chemical Co., Ltd.) and PLAS COAT RZ570 (polyester resin, anionic, manufactured by Goo Chemical Co., Ltd.). One type of the above mentioned dissociable group-containing self-dispersing polymer dispersion liquids each dispersible in an aqueous solvent can be used alone or a plurality of types thereof can be used in combination.

The amount of use of the dissociable group-containing self-dispersing polymer is, to the conductive polymer, preferably 50 to 1000 percent by mass, far preferably 100 to 900 percent by mass and still far preferably 200 to 800 percent by mass.

(3) Polar Solvent

The composition for forming the conductive polymer layer contains the dissociable group-containing self-dispersing polymer, and by containing a polar solvent, stably keeps itself without reducing dispersion stability of the dissociable group-containing self-dispersing polymer and can be stably discharged by inkjet printing.

The polar solvent usable has a dielectric constant of 25 or more, preferably 30 or more and far preferably 40 or more. Examples thereof include ethylene glycol, diethylene glycol, Methylene glycol, propylene glycol, dipropylene glycol, glycerin, dimethylformamide, dimethylacetamide, N-methylpyrrolidone and dimethyl sulfoxide. In particular, propylene glycol, ethylene glycol and dimethyl sulfoxide are preferable in terms of stability of a composition, a discharge property thereof in inkjet printing and conductivity of the conductive polymer layer.

The added amount of the polar solvent can be determined in terms of stability of the composition and is, to the total weight of the composition, preferably 5% or more and 40% or less. This is preferable because when the added amount is 5% or more, the stabilization effect of the composition is improved, whereas when the added amount is 40% or less, surface tension of the composition is low and wettability thereof to the substrate is improved.

The dielectric constant of the solvent is measurable, for example, using a liquid dielectric constant meter Model 871 (manufactured by Nihon Rufuto Co., Ltd.).

(4) Glycol Ether

The composition for forming the conductive polymer layer contains a glycol ether. This can effectively reduce surface tension of the composition containing the polar solvent, without reducing dispersion stability of the dissociable group-containing self-dispersing polymer, and a stable discharge property in inkjet printing and necessary and sufficient wettability on the substrate can be obtained.

In terms of these, the glycol ether is preferably water-soluble and has a surface tension of 40 mN/m or less, far preferably 35 mN/m or less and particularly preferably 30 mN/m or less. The added amount of the glycol ether can be determined on the basis of surface tension of the composition and is, to the total mass of the composition, preferably 5% or more and 30% or less. When the added amount is 5% or more, the surface tension reducing effect is high and wettability of the composition to the substrate is improved, whereas when the added amount is 30% or less, dispersion stability of a composition and application uniformity thereof by inkjet printing are improved.

Examples of the glycol ether include an ethylene glycol alkyl ether, a diethylene glycol alkyl ether, a diethylene glycol alkyl ether, a propylene glycol alkyl ether, a dipropylene glycol alkyl ether and a tripropylene glycol alkyl ether. In terms of viscosity, surface tension and dispersion stability of a composition, an ethylene glycol monoalkyl ether and a propylene glycol monoalkyl ether are preferable.

Examples of the ethylene glycol monoalkyl ether and the propylene glycol monoalkyl ether include ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether and propylene glycol monobutyl ether. In particular, ethylene glycol monobutyl ether and propylene glycol monopropyl ether are preferable.

<<Properties of Transparent Electrode>>

In a transparent electrode in one or more embodiments of the invention, "Ry" and "Ra" denoting surface smoothness of the conductive polymer layer mean as follows; Ry=maximum height (difference in height between the apex and the valley of the surface) and Ra=arithmetical mean roughness, and values thereof are in conformity with surface roughness specified in JIS B601 (1994).

In the transparent electrode in one or more embodiments of the invention, it is preferable that the surface smoothness of the conductive polymer layer be Ry≤50 nm and Ra≤10 nm.

In one or more embodiments of the invention, for Ry and Ra measurement, a commercially available atomic force microscope (AFM) is usable, and Ry and Ra are measurable, for example, by the method described below.

A probe station SPI3800N with a multifunction unit SPA400 manufactured by Seiko Instruments Inc. is used as an AFM. A sample cut out to be an approximately 1 cm square is set on a horizontal sample stage of a piezoelectric scanner, a cantilever is made to approach the sample surface, the sample is scanned in the XY direction when the cantilever reaches a region where interatomic force acts, and asperity of the sample at the time is sensed by displacement of the piezoelectric scanner in the Z direction. The piezoelectric scanner to be used is capable of scanning 20 µm in the XY direction and 2 µm in the Z direction. The cantilever to be used is a silicon cantilever SI-DF20 manufactured by Seiko Instruments Inc. with a resonance frequency of 120 to 150 kHz and a spring constant of 12 to 20 N/m, and the measurement is carried out in DFM (Dynamic Force Mode). A measurement area of 80 µm×80 µm is measured at a scanning frequency of 1 Hz.

In one or more embodiments of the invention, the value of Ry is preferably 50 nm or less and far preferably 40 nm or less. Similarly, the value of Ra is preferably 10 nm or less and far preferably 5 nm or less.

In one or more embodiments of the invention, the transparent electrode has a total luminous transmittance of preferably 60% or more, far preferably 70% or more and particularly preferably 80% or more. The total luminous transmittance is measurable, for example, using a spectrophotometer by a publicly known method.

The electric resistance of the conductive polymer layer of the transparent electrode of the present invention is, by surface resistivity, preferably 1000Ω/□ or less and far preferably 100Ω/□ or less. In order to apply the transparent electrode to a current-driven optoelectronic device, the electric resistance thereof is preferably 50Ω/□ or less and particularly preferably 10Ω/□ or less. The electric resistance being $10^3$Ω/□ or less is preferable because it allows the transparent electrode to function in various optoelectronic devices.

The surface resistivity is measurable, for example, in conformity with JIS K 7194: 1994 (Testing Method for Resistivity of Conductive Plastics with a Four-Point Probe Array) and is simply and easily measurable using a commercially available surface resistivity meter.

The thickness of the transparent electrode in one or more embodiments of the invention is not particularly limited and is appropriately selectable depending on purposes, but preferably 10 µm or less in general. The thinner it is, the higher the transparency and flexibility are, and therefore the thinner the better.

<<Method for Manufacturing Transparent Electrode>>

A method for manufacturing the transparent electrode in accordance with one or more embodiments of the invention mainly includes:

(i) a step of mixing at least a conductive polymer, a self-dispersing polymer, water, a polar solvent other than water, and a glycol ether so as to prepare a composition for forming a transparent electrode;

(ii) a step of forming a conductive metal layer on a transparent substrate; and (iii) a step of discharging the composition for forming a transparent electrode to the transparent substrate by inkjet printing so as to form a polymer conductive layer.

In particular, in the (i) step of preparing the composition, considering dispersion stability, it is preferable to add and mix the liquids in decreasing order of conductivities or dielectric constants, and therefore, while the conductive polymer is stirred, water and the polar solvent other than water are added thereto, and after they are uniformly mixed, the glycol ether is added thereto. Further, for stable discharge by inkjet printing, it is preferable to remove in advance the dissolved gases, such as oxygen and carbon dioxide, from the mixed liquid under reduced pressure.

In the (iii) step of forming the conductive polymer layer, on the transparent substrate on which the thin-metal-wire pattern composed of the metal material is formed, the composition is inkjet-printed and then dried by heating. At the time, with the conductive polymer layer, the pattern-formed thin-metal-wire part may be completely covered, partially covered or partially in contact.

As a method for manufacturing the transparent electrode in which the thin-metal-wire part is partially covered or in contact with the conductive polymer layer containing the conductive polymer and the dissociable group-containing self-dispersing polymer dispersible in an aqueous solvent, there is a method of forming the conductive metal layer on a transfer film by the above described method, stacking the conductive polymer layer containing the conductive polymer and the dissociable group-containing self-dispersing polymer dispersible in an aqueous solvent on the conductive metal layer by the method described below, and transferring the resulting product onto the above described film substrate.

The conductive polymer layer containing the conductive polymer and the dissociable group-containing self-dispersing polymer dispersible in an aqueous solvent can have both high conductivity and high transparency because of the self-dispersing polymer contained therein. By forming the conductive polymer layer having this structure, high conductivity which cannot be obtained by the thin wire composed of metal or metal oxide or the conductive polymer layer alone can be obtained uniformly in the electrode surface.

A ratio of the conductive polymer and the dissociable group-containing self-dispersing polymer dispersible in an aqueous solvent in the conductive polymer layer, which contains the conductive polymer and the dissociable group-containing self-dispersing polymer dispersible in an aqueous solvent, is, to 100 parts by mass of the conductive polymer, preferably 30 to 900 parts by mass of the self-dispersing polymer and, in terms of current leakage prevention, a conductivity enhancement effect of the self-dispersing polymer and transparency, far preferably 100 parts by mass or more of the self-dispersing polymer.

The dry thickness of the conductive polymer layer is preferably 30 to 2000 nm. The thickness is far preferably 100 nm or more in terms of conductivity, and still far preferably 200 nm or more in terms of surface smoothness of the electrode, whereas the thickness is far preferably 1000 nm or less in terms of transparency.

After the conductive polymer layer, which contains the conductive polymer and the dissociable group-containing self-dispersing polymer dispersible in an aqueous solvent, is printed, dry treatment can be carried out as needed.

Although conditions of dry treatment are not particularly limited, dry treatment is carried out preferably in a temperature range in which the transparent substrate and the conductive polymer layer are not damaged. For example, dry treatment can be carried out at 80 to 150° C. for 10 seconds to 30 minutes. This significantly improves cleaning resistance and solvent resistance of the electrode and also improves performance of an element. In particular, in the organic EL element, effects such as decrease in driving voltage and extension of lifetime are obtained.

The composition for forming the transparent electrode may further contain a certain additive.

Examples of the additive include: a plasticizer; stabilizers such as an antioxidant and an anti-sulfurizing agent; a surfactant; a solubility enhancer; a polymerization inhibitor; and colorants such as a dye and a pigment. In order to increase workability such as a discharge property in inkjet printing, a solvent (for example, water and organic solvents such as alcohols, glycols, cellosolves, ketones, esters, ethers, amides and hydrocarbons) may be contained therein.

<<Organic Electronic Element>>

In accordance with one or more embodiments of the invention, an organic electronic element is basically composed of a first electrode, a second electrode and an organic functional layer and has a structure in which the second electrode is arranged opposite to the first electrode, and the organic functional layer is arranged between the first electrode and the second electrode.

As the organic electronic element, for example, an organic EL element or an organic thin-film solar battery element is used, in which the above described transparent electrode is used, particularly as the first electrode.

For example, in an organic EL element, the transparent electrode in accordance with one or more embodiments of the invention is preferably used as the anode, and as an organic functional layer (luminescent layer, etc.) and a second electrode (cathode), ones each having a material, a structure and the like generally used in an organic EL element can be used.

There can be various examples of the structure of the organic EL element, including anode/organic luminescent layer/cathode, anode/hole transport layer/organic luminescent layer/electron transport layer/cathode, anode/hole injection layer/bole transport layer/organic luminescent layer/electron transport layer/cathode, anode/hole injection layer/organic luminescent layer/electron transport layer/electron injection layer/cathode, and anode/hole injection layer/organic luminescent layer/electron injection layer/cathode.

Examples of a luminescent material and a dopant material usable for the organic luminescent layer include, but are not limited to anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complex, tris(8-hydroxyquinolinate) aluminum complex, tris(4-methyl-8-quinolinate) aluminum complex, tris (5-phenyl-8-quinolinate) aluminum complex, aminoquinoline metal complex, benzoquinoline metal complex, tri-(p-terphenyl-4-yl)amine, 1-aryl-2,5-di(2-thienyl)pyrrole derivative, pyran, quinacridone, rubrene, distylbenzene derivative, distylarylene derivative, and various fluorescent dyes, rare earth metal complexes and phosphorescent materials. The organic luminescent layer preferably contains 90 to 99.5 parts by mass of a luminescent material and 0.5 to 10 parts by mass of a dopant material selected from the above mentioned compounds.

The organic luminescent layer is formed using any of the above mentioned materials and the like by a publicly known method, such as vapor deposition, application or transfer. The thickness of the organic luminescent layer is preferably 0.5 to 500 nm and particularly preferably 0.5 to 200 nm.

The organic EL element in accordance with one or more embodiments of the invention is usable for a self-emitting display, a back light for a liquid crystal device, an illumination device and the like. The organic EL element in accordance with one or more embodiments of the invention is preferably used for illumination purposes because it can uniformly emit light with no unevenness.

The transparent electrode in accordance with one or more embodiments of the invention has both high conductivity and high transparency and is suitably usable in the fields of: various optoelectronic devices, such as liquid crystal display elements, organic luminescent elements, inorganic electroluminescent elements, electronic paper, organic solar batteries and inorganic solar batteries; electromagnetic shields; and touch panels. Among them, it can be particularly preferably used as a transparent electrode of an organic EL element or an organic thin-film solar battery element strictly demanded to have surface smoothness of the transparent electrode.

<<Structure and Manufacturing Method of Organic EL Element (10)>>

Figure 3:
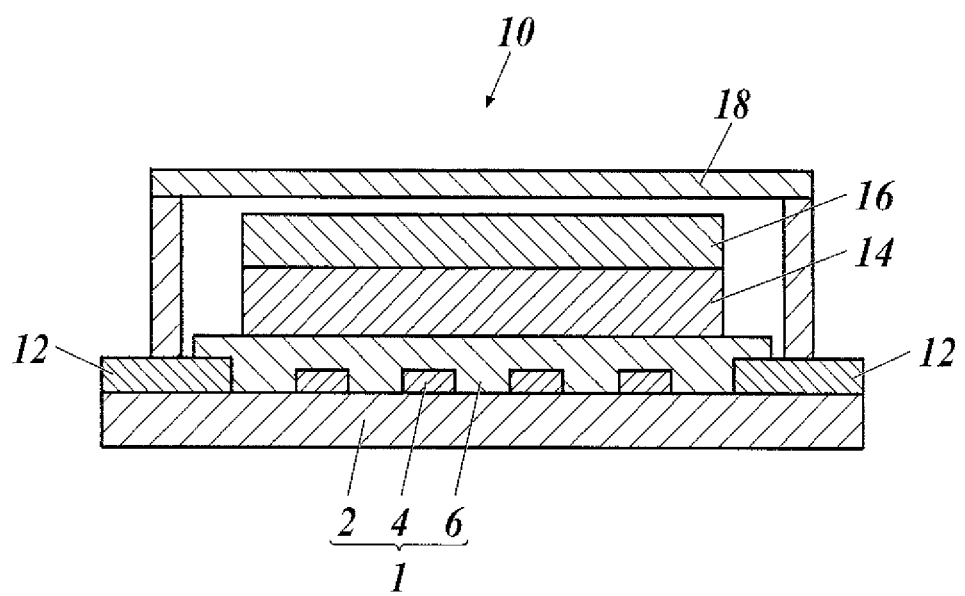
FIG. 3 is a cross-sectional view showing a schematic structure of an organic EL element in accordance with one or more embodiments of the invention.

As shown in FIG. 3, an organic EL element 10 has a transparent electrode 1 composed of a transparent substrate 2, a conductive metal layer 4 and a conductive polymer layer 6 in accordance with one or more embodiments of the invention.

On the side edge parts of the transparent substrate 2 of the transparent electrode 1, extraction electrodes 12 are formed. The extraction electrodes 12 are in contact with the conductive metal layer 4 and the conductive polymer layer 6 and electrically conductive with these members. On the conductive polymer layer 6 of the transparent electrode 1, an organic luminescent layer 14 is formed. The organic luminescent layer 14 is composed of a positive hole transport layer, a luminescent layer, a positive hole block layer, an electron transport layer and the like. On the organic luminescent layer 14, a counter electrode 16 is formed. The counter electrode 16 is an electrode facing the transparent electrode 1 and having a polarity opposite to that of the transparent electrode 1.

The organic El element 1 is sealed by a sealing member 18 with parts of the extraction electrodes 12 exposed, so that the transparent electrode 1 and the organic luminescent layer 14 are covered with and protected by the sealing member 18.

Next, a method for manufacturing an organic EL element (10) is described with reference to FIGS. 4A to 4F in accordance with one or more embodiments of the invention.

Figure 4A:
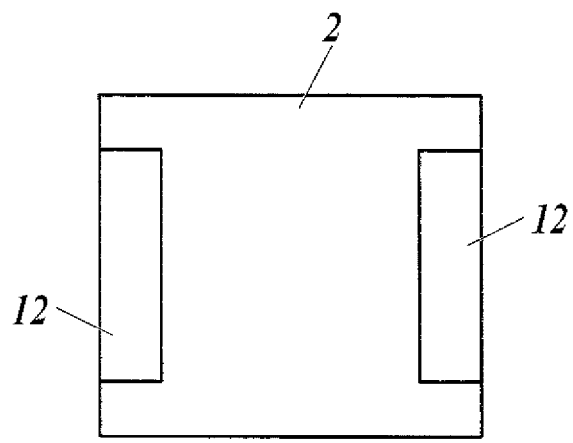
FIG. 4A is a schematic plan view for explaining a method for manufacturing the organic EL element chronologically in accordance with one or more embodiments of the invention.

First, ITO is deposited on a transparent substrate 2, and this is patterned in a predetermined shape by photolithography, whereby extraction electrodes 12 are formed (FIG. 4A).

Figure 4B:
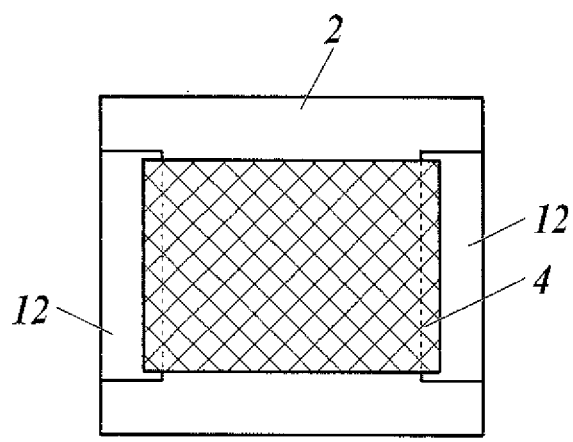
FIG. 4B is a plan view for explaining a step following that of FIG. 4A in accordance with one or more embodiments of the invention.

Then, a conductive metal layer 4 is formed by patterning in such a way as to overlap the extraction electrodes 12 (FIG. 4B).

Figure 4C:
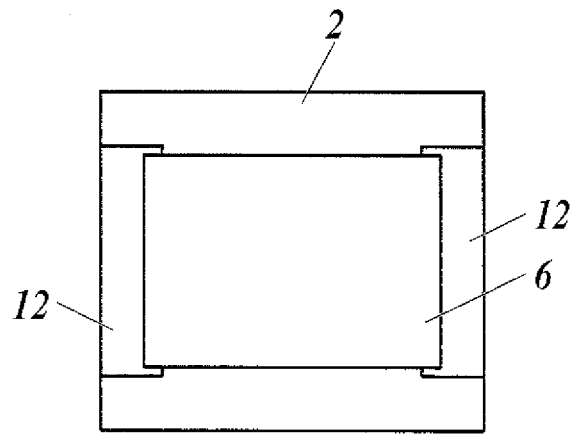
FIG. 4C is a plan view for explaining a step following that of FIG. 4B in accordance with one or more embodiments of the invention.

Then, a certain composition composed of a conductive polymer, a self-dispersing polymer and the like is prepared, the composition is inkjet-printed on the conductive metal layer 4 and dried, thereby forming a conductive polymer layer 6, and the conductive polymer layer 6 covers the conductive metal layer 4 (FIG. 4C).

Figure 4D:
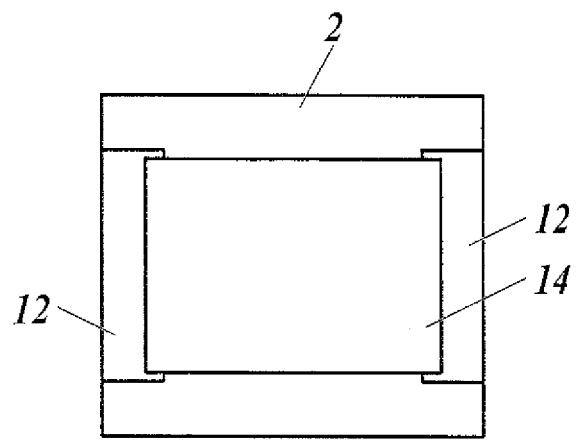
FIG. 4D is a plan view for explaining a step following that of FIG. 4C in accordance with one or more embodiments of the invention.

Then, on the conductive polymer layer 6 (transparent electrode 1), an organic luminescent layer 14 composed of a positive hole transport layer, a luminescent layer, a positive hole block layer, an electron transport layer and the like is formed (FIG. 4D).

Figure 4E:
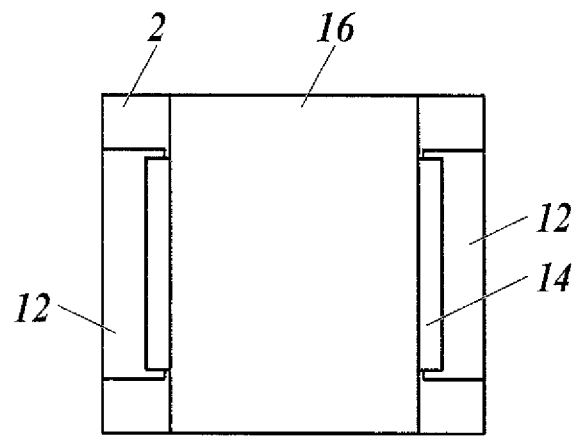
FIG. 4E is a plan view for explaining a step following that of FIG. 4D in accordance with one or more embodiments of the invention.
Figure 4F:
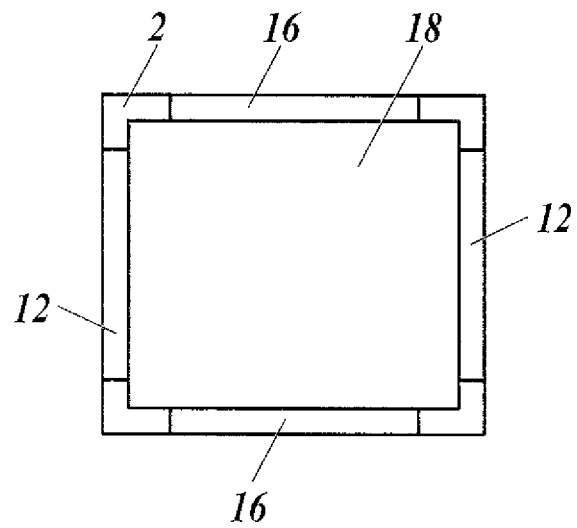
FIG. 4F is a plan view for explaining a step following that of FIG. 4E in accordance with one or more embodiments of the invention.

Then, a counter electrode 16 is formed in such a way as to cover the organic luminescent layer 14 (FIG. 4E), and the transparent electrode 1 and the organic luminescent layer 14 are sealed by a sealing member 18 in such a way that the transparent electrode 1 and the entire organic luminescent layer 14 are covered therewith (FIG. 4F).

Through these steps, an organic EL element 10 is manufactured.

EXAMPLES

Hereinafter, embodiments of the invention are more specifically described with examples. However, the present invention is not limited thereto. Note that "parts" and "%" used in the examples stand for "parts by mass" and "percent by mass (mass %)", respectively, unless otherwise specified.

(1) Manufacture of Transparent Substrate (1.1) Formation of Smooth Layer

To a no-undercoated side of a 100 μm thick polyethylene terephthalate film (Cosmoshine A4100 manufactured by Toyobo Co., Ltd.), a UV curable organic/inorganic hybrid hard coat material OPSTAR Z7501 manufactured by JSR Corporation was (i) applied with a wire bar in such a way that the average thickness thereof after application and drying was 4 μm, (ii) dried at 80° C. for three minutes, and then (iii) cured at 1.0 J/cm$^2$ as a cure condition under the air atmosphere using a high-pressure mercury lamp. Thus, a smooth layer was formed.

(1.2) Formation of Gas Barrier Layer

Next, on a sample substrate provided with the smooth layer, a gas barrier layer was formed under the conditions below.

(1.2.1) Application of Gas Barrier Layer Application Liquid

A 20 mass % dibutyl ether solution of perhydropolysilazane (PHPS, Aquamica NN320 manufactured by AZ Electronic Materials) was applied with a wire bar in such a way that the (average) thickness after drying was 0.30 μm, thereby obtaining an applied sample.

(1.2.2) Dry Treatment and Dehumidification Treatment (First Step; Dry Treatment)

The obtained applied sample was processed under an atmosphere where the temperature was 85° C. and the humidity was 55% RH for one minute, thereby obtaining a dried sample.

(Second Step; Dehumidification Treatment)

The dried sample was kept under an atmosphere where the temperature was 25° C. and the humidity was 10% RH (dew-point temperature of −8° C.) for 10 minutes as dehumidification treatment.

(1.2.3) Modification Treatment

The sample subjected to the dehumidification treatment was modified under the conditions below using the device below. Thus, the gas barrier layer was formed. The dew-point temperature at the modification treatment was −8° C.

(Modification Device)

Excimer irradiation unit Model MECL-M-1-200 manufactured by M.D.COM., Inc., wavelength of 172 nm, lamp filled gas of Xe (Modification Conditions)

Excimer laser intensity: 60 mW/cm$^2$ (172 nm)
Distance between sample and light source: 1 mm
Stage heating temperature: 70° C.
Oxygen concentration in irradiation unit: 1%
Excimer laser irradiation time: 3 seconds A film substrate for a transparent electrode having a gas barrier property was thus manufactured.

(2) Formation of Conductive Metal Layer

A conductive metal layer was formed on a no-barrier side of the obtained film substrate for a transparent electrode having a gas barrier property by the method described below.

A silver nano-ink (TEC-PR-030 manufactured by InkTec Co., Ltd.) was applied onto the film substrate using a gravure proofer K303 Multicoater (manufactured by RK Print Coat Instruments, Ltd.) so as to form the conductive metal layer in a thin metal wire pattern in a region indicated by (4) in FIG. 4B, the pattern being a mesh pattern having a width of 50 μm and an interval of 1.0 mm. This was heated at 120° C. for 30 minutes.

The pattern of the conductive metal layer was measured with a high-luminescent non-contact three-dimensional surface roughness meter Wyko NT9100 (manufactured by Nihon Veeco K.K.). The width of the pattern was 60 μm, and the average height thereof was 500 nm.

First Example (1) Preparation of Composition (Samples) for Forming Transparent Electrode Each of Samples 1-1 to 1-26 of compositions for forming transparent electrodes (compositions for discharge by inkjet printing for forming conductive polymer layers) was prepared as follows; to be an ink concentration (polymer concentration) shown in TABLE 1, a conductive polymer P-1, namely, Clevios PH750 (1.08% liquid, manufactured by Heraeus Holding), and a dissociable group-containing self-dispersing polymer shown in TABLE 1 were mixed at a solid ratio of 15:85, the mixture was mixed with solvents shown in TABLE 1, and water was added thereto at the end to be 100 parts by weight.

TABLE 1

| SAMPLE OF COMPOSITION | BINDER RESIN (SELF-DISPERSING POLYMER) | | | | INK CONCENTRATION (%) | POLAR SOLVENT | | GLYCOL ETHER | |
|---|---|---|---|---|---|---|---|---|---|
| | TYPE | MODEL NUMBER | Tg (°C.) | *1 (%) | | TYPE | *2 (%) | TYPE | *2 (%) |
| 1-1 | VYLONAL | LMD-2000 | 67 | 40 | 3.8 | EG | 6 | EGPr | 8 |
| 1-2 | | LMD-1245 | 61 | 30 | 3.5 | | 20 | EGBu | 15 |
| 1-3 | | LMD-1500 | 77 | 30 | 3.7 | PG | 15 | PGEt | 10 |
| 1-4 | | | | 30 | 3.5 | | 25 | PGPr | 18 |
| 1-5 | VYLONAL | LMD-2000 | 67 | 40 | 3.8 | DMSO | 10 | EGBu | 10 |
| 1-6 | | LMD-1245 | 61 | 30 | 3.6 | | 15 | PGPr | 18 |
| 1-7 | | LMD-1500 | 77 | 30 | 3.7 | | 15 | EGBu | 18 |
| 1-8 | | LMD-2000 | 67 | 40 | 3.5 | | 20 | PGPr | 20 |
| 1-9 | | LMD-1245 | 61 | 30 | 3.7 | | 15 | EGBu | 25 |
| 1-10 | VYLONAL | LMD-1500 | 77 | 30 | 3.2 | NMP | 10 | EGBu | 15 |
| 1-11 | | LMD-2000 | 67 | 40 | 3.3 | | 15 | PGPr | 15 |
| 1-12 | | | | 40 | 3.5 | dEG | 15 | EGBu | 10 |
| 1-13 | | | | 40 | 3.5 | tEG | 15 | | 10 |
| 1-14 | VYLONAL | LMD-1500 | 77 | 30 | 3.5 | EG | 15 | — | — |
| 1-15 | | | | 30 | 3.5 | PG | 15 | | |
| 1-16 | | | | 30 | 3.7 | | 20 | | |
| 1-17 | | | | 30 | 3.5 | DMSO | 15 | | |
| 1-18 | | LMD-2000 | 67 | 40 | 3.8 | | 20 | | |
| 1-19 | | LMD-1500 | 77 | 30 | 3.4 | PrOH | 15 | | |
| 1-20 | VYLONAL | LMD-2000 | 67 | 40 | 3.5 | — | — | EGPr | 10 |
| 1-21 | | LMD-1500 | 77 | 30 | 3.3 | | | | 25 |
| 1-22 | | LMD-2000 | 67 | 40 | 3.7 | | | EGBu | 15 |
| 1-23 | | LMD-1500 | 77 | 30 | 3.2 | | | | 20 |
| 1-24 | | LMD-2000 | 67 | 40 | 3.5 | | | PGEt | 15 |
| 1-25 | | | | 40 | 3.5 | | | PGPr | 5 |
| 1-26 | | LMD-1245 | 61 | 30 | 3.2 | | | | 15 |

*1: CONCENTRATION
*2: ADDED AMOUNT

The manufacturer of the self-dispersing polymers in TABLE 1 is as follows.

VYLONAL: Toyobo Co., Ltd.

The abbreviations of the solvents (polar solvents and glycol ethers) in TABLE 1 stand for the solvents below.

EG: ethylene glycol
PG: propylene glycol
dEG: diethylene glycol
tEG: triethylene glycol
DMSO: dimethyl sulfoxide
NMP: N-methylpyrrolidone
PrOH: 2-propanol
EGEt: ethylene glycol monoethyl ether
EGPr: ethylene glycol monopropyl ether
EGBu: ethylene glycol monobutyl ether
PGEt: propylene glycol monoethyl ether
PGPr: propylene glycol monopropyl ether The glass transition temperatures (Tg) of the self-dispersing polymers in TABLE 1 were obtained at a temperature rise rate of 10° C./min using a scanning differential calorimeter (Model DSC-7 manufactured by PerkinElmer Inc.) in conformity with JIS K7121 (1987).

(2) Evaluation of Samples

As the evaluation of Samples 1-1 to 1-26, the dispersion stability of the compositions over time, the discharge stability thereof in inkjet printing and the formation property of the conductive polymer layer patterns were evaluated.

(2.1) Dispersion Stability over Time

The dispersion stability of the compositions over time was evaluated as follows; each sample was left at room temperature for three days, and a percentage of viscosity change between before and after that was evaluated according to the following criteria. The viscosity was measured at room temperature with an oscillation type viscometer VISCOMATE VM-1G (manufactured by Yamaichi Electronics Co., Ltd.). The measurement result is shown in TABLE 2.

⊚ (double circle): 90% or more and less than 110%
○ (single circle): 110% or more and less than 120%
Δ (triangle): 120% or more and less than 150%
x (single cross): 150% or more and less than 200%
xx (double cross): 200% or more (2.2) Discharge Stability The discharge stability in inkjet printing was evaluated as follows; a rectangular solid pattern composed of each sample was printed on inkjet paper, and the image was visually evaluated according to the following criteria. The evaluation result is shown in TABLE 2.

Inkjet printing was carried out using a desktop-type robot Shotmaster-300 (manufactured by Musashi Engineering, Inc.) provided with an inkjet head (from Konica Minolta IJ Technologies, Inc.) and was controlled by an inkjet evaluation system EB150 (manufactured by Konica Minolta IJ Technologies, Inc.). The solid pattern density was adjusted with a print resolution (500 to 1000 dpi) in accordance with the ink concentration and was printed at a driving voltage of 12 V.

○ (circle): printed with no line or flaw
Δ (triangle): five or less lines or five or less flaws
x (cross): six or more lines or six or more flaws (2.3) Pattern Formation Property The formation property of the polymer conductive layer patterns was evaluated as follows; a rectangular solid pattern composed of each sample was printed on a transparent glass substrate and subjected to a durability test, the image before and after the test was visually evaluated, and reproducibility of the image was evaluated according to the following criteria. The evaluation result is shown in TABLE 2.

As the durability test, the transparent glass substrate was soaked in 2-propanol, subjected to ultrasonic cleaning for 10 minutes with an ultrasonic cleaner Bransonic 3510J-MT (manufactured by Emerson Japan, Ltd.) and then dried at 100° C. for two minutes.

Solid Printing Visual Evaluation

○ (single circle): displacement from the original pattern size in vertical and horizontal directions is less than 0.5 mm Δ (triangle): displacement from the original pattern size in vertical and/or horizontal directions is 0.5 mm or more and less than 1 mm x (single cross): displacement from original pattern size in vertical and/or horizontal directions is 1 mm or more and less than 5 mm xx (double cross): displacement from original pattern size in vertical and/or horizontal directions is 5 mm or more

- (hyphen): not evaluated owing to poor injection

TABLE 2

| SAMPLE OF COMPOSITION | STABILITY OVER TIME | DISCHARGE PROPERTY | PATTERN FORMATION PROPERTY | REMARK |
|---|---|---|---|---|
| 1-1 | ○ | ○ | ○ | EXAMPLE |
| 1-2 | ◎ | ○ | ○ | |
| 1-3 | ○ | ○ | ○ | |
| 1-4 | ◎ | ○ | ○ | |
| 1-5 | ○ | ○ | ○ | |
| 1-6 | ◎ | ○ | ○ | |
| 1-7 | ◎ | ○ | ○ | |
| 1-8 | ◎ | ○ | ○ | |
| 1-9 | ◎ | ○ | ○ | |
| 1-10 | ○ | ○ | ○ | |
| 1-11 | ○ | ○ | ○ | |
| 1-12 | ○ | ○ | ○ | |
| 1-13 | ○ | ○ | ○ | |
| 1-14 | ◎ | ○ | XX | COMPARATIVE EXAMPLE |
| 1-15 | ◎ | ○ | X | |
| 1-16 | ◎ | ○ | X | |
| 1-17 | ◎ | ○ | XX | |
| 1-18 | ◎ | ○ | XX | |
| 1-19 | X | Δ | — | |
| 1-20 | XX | X | — | COMPARATIVE EXAMPLE |
| 1-21 | X | X | | |
| 1-22 | X | X | | |
| 1-23 | XX | X | | |
| 1-24 | XX | X | | |
| 1-25 | X | X | | |
| 1-26 | X | X | | |

(3) Conclusion

As shown in TABLE 2, when Samples 1-1 to 1-13 were compared with Samples 1-14 to 1-26, the former samples were excellent in all of the stability over time, the discharge stability and the pattern formation property.

From this, it is understood that a composition containing a certain self-dispersing polymer, a certain polar solvent and a certain glycol ether is optimum for discharge by inkjet printing in accordance with one or more embodiments of the invention.

It is also understood that even when a resin substrate (PET film) and/or a self-dispersing polymer each having a low glass transition temperature are used, the stability over time, the discharge stability and the pattern formation property are all excellent, and therefore the above described composition is suitable for mass production of transparent electrodes in accordance with one or more embodiments of the invention.

Second Example (1) Manufacture of Transparent Electrode (Samples)

(1.1) Preparation of Composition for Forming Transparent Electrode

Each of Samples 2-1 to 2-14 of compositions for forming transparent electrodes (compositions for discharge by inkjet printing for forming conductive polymer layers) was prepared as follows; to be an ink concentration (polymer concentration) shown in TABLE 3, a conductive polymer P-1 and a dissociable group-containing self-dispersing polymer shown in TABLE 3 were mixed at a solid ratio of 15:85, the mixture was mixed with solvents shown in TABLE 3, and water was added thereto at the end to be 100 parts by weight.

In addition, each of Samples 2-15 to 2-30 of compositions for forming transparent electrodes was prepared in the same way as that described above except that, in each of these samples, as solid contents, a conductive polymer P-1, poly (3,4-ethylene dioxythiophene)/Nafion® P-2 and a self-dispersing polymer shown in TABLE 3 were mixed at a solid ratio of 15:10:75.

P-2 was prepared by a method described in Example 16 of Japanese Patent No. 4509787, and a 2.6% dispersion liquid was prepared.

TABLE 3

| SAMPLE OF TRANSPARENT ELECTRODE | BINDER RESIN (SELF-DISPERSING POLYMER) | | | | INK | POLAR SOLVENT | | GLYCOL ETHER | |
|---|---|---|---|---|---|---|---|---|---|
| | TYPE | MODEL NUMBER | Tg (° C.) | *1 (%) | CONCENTRATION (%) | TYPE | *2 (%) | TYPE | *2 (%) |
| 2-1 | POLYSOL | FP-3000 | 40 | 54.4 | 3.7 | EG | 15 | EGBu | 20 |
| 2-2 | | | | | 3.7 | DMSO | 12 | | 18 |
| 2-3 | VYLONAL | LMD-1245 | 61 | 30.0 | 3.5 | PG | 15 | PGPr | 15 |
| 2-4 | | | | | 3.5 | DMSO | 18 | | 15 |
| 2-5 | | LMD-1500 | 77 | 30.0 | 3.4 | DMSO | 15 | EGPr | 20 |
| 2-6 | | | | | 3.4 | dEG | 10 | EGBu | 15 |
| 2-7 | | LMD-2000 | 67 | 40.0 | 2.7 | tEG | 15 | PGPr | 30 |
| 2-8 | | | | | 3.3 | DMSO | 15 | EGBu | 10 |
| 2-9 | PLAS COAT | RZ-105 | 52 | 25.0 | 3.1 | DMSO | 20 | EGBu | 20 |
| 2-10 | | | | | 3.2 | | 15 | | 20 |
| 2-11 | | RZ-570 | 60 | 25.0 | 3.3 | PG | 15 | EGBu | 25 |
| 2-12 | | | | | 2.8 | DMSO | 15 | | 30 |
| 2-13 | | Z-561 | 64 | 25.0 | 3.4 | DMSO | 15 | EGBu | 25 |

TABLE 3-continued

| SAMPLE OF TRANSPARENT ELECTRODE | BINDER RESIN (SELF-DISPERSING POLYMER) | | | | INK CONCENTRATION (%) | POLAR SOLVENT | | GLYCOL ETHER | |
|---|---|---|---|---|---|---|---|---|---|
| | TYPE | MODEL NUMBER | Tg (° C.) | *1 (%) | | TYPE | *2 (%) | TYPE | *2 (%) |
| 2-14 | | | | | 3 | PG | 15 | PGPr | 25 |
| 2-15 | YODOSOL | AD-81B | 20 | 47.0 | 3 | PG | 15 | PGPr | 15 |
| 2-16 | | | | | 3.4 | DMSO | 12 | EGBu | 15 |
| 2-17 | MOWINYL | LDM-6740 | 15 | 50.0 | 3 | PG | 15 | PGPr | 15 |
| 2-18 | | | | | 3.4 | DMSO | 12 | EGBu | 15 |
| 2-19 | ELITEL | KT-8701 | 13 | 29.0 | 3.1 | DMSO | 10 | EGBu | 15 |
| 2-20 | | | | | 3.3 | dEG | 10 | | 15 |
| 2-21 | VYLONAL | MD-1480 | 20 | 25.0 | 3.2 | EG | 20 | PGPr | 20 |
| 2-22 | | | | | 3.3 | PG | 20 | | 15 |
| 2-23 | | | | | 3.3 | DMSO | 12 | | 15 |
| 2-24 | | | | | 3.1 | | 15 | EGBu | 20 |
| 2-25 | PLAS COAT | Z-690 | 110 | 25.0 | 3 | DMSO | 15 | EGBu | 20 |
| 2-26 | | | | | 3.3 | EG | 20 | PGPr | 20 |
| 2-27 | ELITEL | KA-3556 | 81 | 30.0 | 3.2 | DMSO | 15 | EGBu | 20 |
| 2-28 | | | | | 3.5 | EG | 20 | PGPr | 20 |
| 2-29 | VYLONAL | MD-2000 | 67 | 40.0 | 3.4 | DMSO | 15 | PGPr | 15 |
| 2-30 | PLAS COAT | RZ-105 | 52 | 25.0 | 3.1 | DMSO | 20 | EGBu | 18 |

*1: CONCENTRATION
*2: ADDED AMOUNT

The manufacturers of the self-dispersing polymers in TABLE 3 are as follows.
POLYSOL: Showa Denko K.K.
VYLONAL: Toyobo Co., Ltd.
PLAS COAT: Goo Chemical Co., Ltd.
YODOSOL: Henkel Japan Ltd.
MOWINYL: The Nippon Synthetic Chemical Industry Co., Ltd.
ELITEL: Unitika Ltd.
The abbreviations of the solvents (polar solvents and glycol ethers) in TABLE 3 stand for the solvents below.
EG: ethylene glycol
PG: propylene glycol
dEG: diethylene glycol
tEG: triethylene glycol
DMSO: dimethyl sulfoxide
NMP: N-methylpyrrolidone
PrOH: 2-propanol
EGEt: ethylene glycol monoethyl ether
EGPr: ethylene glycol monopropyl ether
EGBu: ethylene glycol monobutyl ether
PGEt: propylene glycol monoethyl ether
PGPr: propylene glycol monopropyl ether (1.2) Formation of Conductive Polymer Layer Each of Samples 2-1 to 2-30 of transparent electrodes was manufactured as follows; using each of Samples 2-1 to 2-30 of the compositions for forming transparent electrodes described above, inkjet printing was carried out on the transparent substrate on which the conductive metal layer had been formed with the gravure printer, the transparent substrate being composed of the film substrate having the gas barrier property, and the resulting product was dried at 80° C. for two minutes and then heated at 110° C. for 30 minutes.

(2) Evaluation of Samples

The transparency, the conductivity (surface resistivity) and the smoothness (surface roughness) of the obtained transparent electrodes were evaluated as described below. In addition, the stability of the transparent electrodes was evaluated as described above after the transparent electrodes were left under an environment of 80° C. and 90% RH for five days as a forced degradation test.

(2.1) Transparency

The total luminous transmittance was measured using a Haze Meter NDH5000 manufactured by Tokyo Denshoku Co., Ltd. in conformity with JIS K 7361-1: 1997 and evaluated according to the following criteria. The evaluation result is shown in TABLE 4. The transmittance is preferably 75% or more for use in an organic electronic device.

⊚ (double circle): 80% or more
○ (single circle): 75% or more and less than 80%
Δ (triangle): 70% or more and less than 75%
x (cross): less than 70%

(2.2) Conductivity

The surface resistivity was measured using a resistivity meter (Loresta GP (Model MCP-T610) manufactured by Dia Instruments Co., Ltd.) in conformity with JIS K 7194: 1994 and evaluated according to the following criteria. The evaluation result is shown in TABLE 4. The surface resistivity is preferably 100Ω/□ or less and, for a larger organic electronic device, far preferably 30Ω/□ or less.

⊚ (double circle): less than 30Ω/□
○ (single circle): 30 or more and less than 50
Δ (triangle): 50 or more and less than 100
x (single cross): 100 or more and less than 500
xx (double cross): 500 or more (2.3) Smoothness (Surface Roughness (Ra))

The measurement was carried out using each sample cut out to be an approximately 1 cm square with an AFM (probe station SPI3800N with a multifunction unit SPA400 manufactured by Seiko Instruments Inc.) by the above described method (in conformity with surface roughness specified by JIS B601 (1994)). The evaluation was made by the value of Ra according to the following criteria. The evaluation result is shown in TABLE 4.

⊚ (double circle): less than 5 nm
○ (single circle): 5 or more and less than 10
Δ (triangle): 10 or more and less than 20
x (single cross): 20 or more and less than 50
xx (double cross): 50 or more

TABLE 4

| SAMPLE OF TRANSPARENT ELECTRODE | BEFORE DEGRADATION TEST *1 | *2 | *3 | AFTER DEGRADATION TEST *1 | *2 | *3 | REMARK |
|---|---|---|---|---|---|---|---|
| 2-1 | ◎ | ◎ | ◎ | ○ | ◎ | ○ | EXAMPLE |
| 2-2 | ◎ | ◎ | ◎ | ○ | ◎ | ○ | |
| 2-3 | ◎ | ◎ | ◎ | ○ | ◎ | ◎ | |
| 2-4 | ◎ | ◎ | ◎ | ○ | ◎ | ◎ | |
| 2-5 | ◎ | ◎ | ◎ | ◎ | ◎ | ◎ | |
| 2-6 | ◎ | ◎ | ◎ | ◎ | ◎ | ◎ | |
| 2-7 | ◎ | ◎ | ◎ | ◎ | ◎ | ◎ | |
| 2-8 | ◎ | ◎ | ◎ | ◎ | ◎ | ◎ | |
| 2-9 | ◎ | ◎ | ◎ | ○ | ◎ | ○ | |
| 2-10 | ◎ | ◎ | ◎ | ○ | ◎ | ○ | |
| 2-11 | ◎ | ◎ | ◎ | ○ | ◎ | ○ | |
| 2-12 | ◎ | ◎ | ◎ | ○ | ◎ | ○ | |
| 2-13 | ◎ | ◎ | ◎ | ◎ | ◎ | ◎ | |
| 2-14 | ◎ | ◎ | ◎ | ◎ | ◎ | ◎ | |
| 2-15 | △ | ○ | △ | X | X | X | COMPARATIVE |
| 2-16 | △ | ○ | △ | X | X | X | EXAMPLE |
| 2-17 | △ | △ | △ | X | X | X | |
| 2-18 | △ | △ | △ | X | X | X | |
| 2-19 | X | X | △ | X | X | X | |
| 2-20 | X | X | △ | X | X | X | |
| 2-21 | ○ | ◎ | △ | △ | XX | X | |
| 2-22 | ○ | ◎ | △ | △ | XX | X | |
| 2-23 | ○ | ◎ | △ | △ | XX | X | |
| 2-24 | ○ | ◎ | △ | △ | X | X | |
| 2-25 | △ | △ | X | △ | △ | X | |
| 2-26 | △ | △ | X | △ | △ | X | |
| 2-27 | ○ | △ | △ | △ | X | △ | |
| 2-28 | ○ | △ | △ | △ | X | △ | |
| 2-29 | ◎ | ◎ | ◎ | ◎ | ◎ | ◎ | EXAMPLE |
| 2-30 | ◎ | ◎ | ◎ | ○ | ◎ | ○ | |

*1: TRANSPARENCY
*2: CONDUCTIVITY
*3: SMOOTHNESS (3) Conclusion

As shown in TABLE 4, Samples 2-1 to 2-14 and 2-29 to 2-30 of the transparent electrodes each manufactured with the composition containing a certain self-dispersing polymer, a certain polar solvent and a certain glycol ether were excellent in all of the transparency, the conductivity and the smoothness as compared with Samples 2-15 to 2-28 as comparative examples and also maintained these properties even after the degradation test carried out at high temperature and high humidity.

From this, it is understood that use of the above described composition in manufacturing a transparent electrode also prevents performance of the transparent electrode itself from degrading in accordance with one or more embodiments of the invention.

Third Example (1) Manufacture of Organic EL Element (Samples)

Samples 3-1 to 3-30 of organic EL elements were manufactured using the transparent electrodes manufactured in Second Example before subjected to the degradation text, respectively, by the method described below.

(1.1) Formation of Organic Functional Layer

On each transparent electrode, an organic functional layer (including a positive hole transport layer, a luminescent layer, a positive hole block layer and an electron transport layer) was formed as described below.

The organic functional layer was formed by vapor deposition.

Vapor-deposition crucibles of a commercially available vacuum deposition device were filled with constitutive materials for the respective layers at their respective optimum amounts to manufacture an element. The vapor-deposition crucibles used were made of a molybdenum material or a tungsten material for resistance heating.

(1.1.1) Formation of Positive Hole Transport Layer

The pressure was reduced to $1 \times 10^{-4}$ Pa, and the vapor-deposition crucible having Compound 1 therein was electrically heated, and on the transparent electrode, Compound 1 was deposited in a region (14) shown in FIG. 4D at a deposition rate of 0.1 nm/sec. Thus, a positive hole transport layer having a thickness of 30 nm was formed.

(1.1.2) Formation of Luminescent Layer

Next, a luminescent layer was formed according the procedure described below. On the formed positive hole transport layer, Compound 2, Compound 3 and Compound 5 were co-deposited in the region (14) shown in FIG. 4D at a deposition rate of 0.1 nm/sec in such a way that Compound 2 was 13.0 percent by mass, Compound 3 was 3.7 percent by mass and Compound 5 was 83.3 percent by mass in concentration. Thus, a green-and-red phosphorescent layer having a maximum emission wavelength of 622 nm and a thickness of 10 nm was formed.

Next, Compound 4 and Compound 5 were co-deposited in the region (14) shown in FIG. 4D at a deposition rate of 0.1 nm/sec in such a way that Compound 4 was 10.0 percent by mass and Compound 5 was 90.0 percent by mass in concentration. Thus, a blue phosphorescent layer having a maximum emission wavelength of 471 nm and a thickness of 15 nm was formed.

(1.1.3) Formation of Positive Hole Block Layer

On the formed luminescent layer, Compound 6 was deposited in the region (14) shown in FIG. 4D. Thus, a positive hole block layer having a thickness of 5 μm was formed.

(1.1.4) Formation of Electron Transport Layer

Next, on the formed positive hole block layer, CsF and Compound 6 were co-deposited in the region (14) shown in FIG. 4D in such a way that CsF was 10% in film thickness percentage. Thus, an electron transport layer having a thickness of 45 nm was formed.

[Chem. 1]

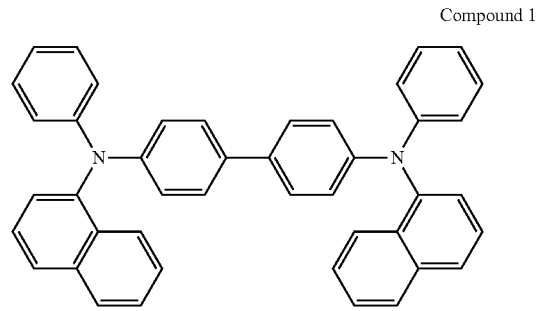

Compound 1

-continued

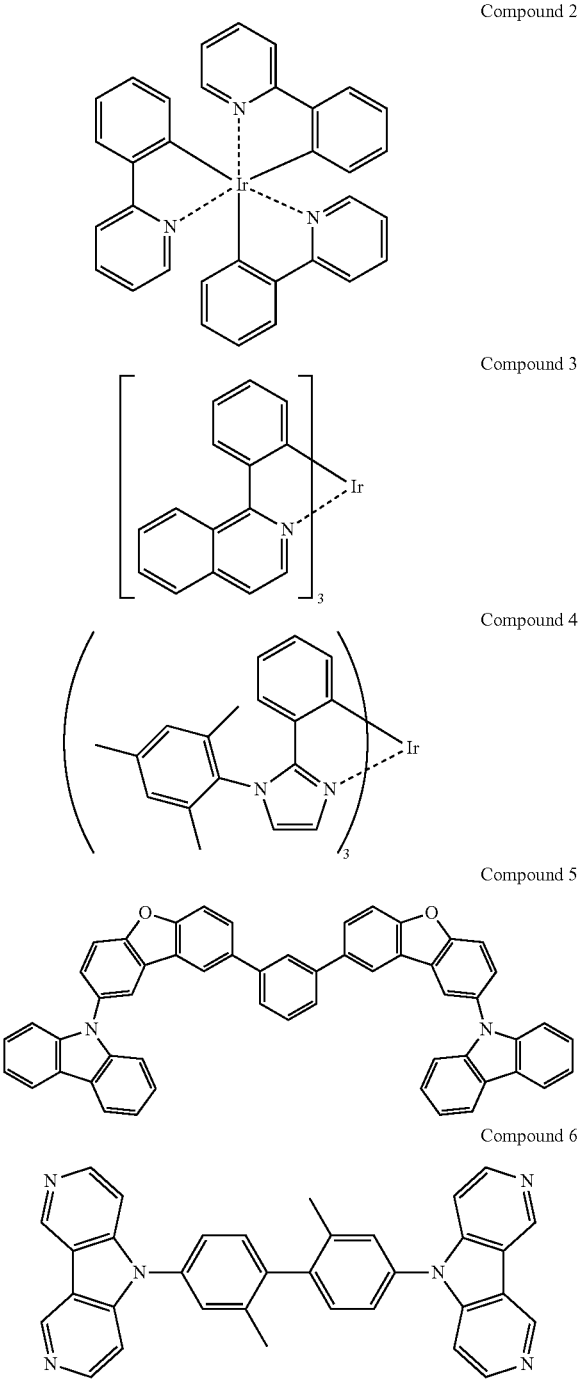

Compound 2

Compound 3

Compound 4

Compound 5

Compound 6

(1.2) Formation of Second Electrode

On the formed electron transport layer, Al was deposited in a region (16) shown in FIG. 4E under a vacuum of $5\times10^{-4}$ Pa. Thus, a cathode electrode having a thickness of 100 nm was formed.

(1.3) Formation of Sealing Film

On the formed electron transport layer, a flexible sealing member composed of $Al_2O_3$ deposited to be 300 nm thick with polyethylene terephthalate as a base was used. The flexible sealing member was glued to a region (18) shown in FIG. 4F with an adhesive, and the adhesive was cured by heat treatment so that sealing was carried out. ITO and Al outside the sealing member were made to be external extraction terminals of the transparent electrode (anode) and the second electrode (cathode), respectively. Thus, each organic EL element was manufactured.

(2) Evaluation of Samples

Emission uniformity (emission unevenness) and emission lifetime of the obtained organic EL elements were evaluated as described below.

(2.1) Emission Uniformity

A DC voltage was applied to each organic EL element using a source measure unit Model 2400 manufactured by Keithley Instruments so that the organic EL element emitted light. Samples 3-1 to 3-30 of the organic EL elements which emitted light at 1000 $cd/m^2$ were observed under a microscope with a magnification of 50 times to determine luminance unevenness in the emission and evaluated according to the following criteria.

In addition, Samples 3-1 to 3-30 of the organic EL elements were heated in an oven at 60% RH and 80° C. for five hours and then subjected to humidity control under an environment of 23±3° C. and 55±3% RH for one hour or more. Then, Samples 3-1 to 3-30 thereof were observed again in the same way as that described above to determine the emission uniformity.

The observation result before and after the degradation test is shown in TABLE 5.

⊚ (double circle): nothing to say but perfect with completely uniform emission

○ (single circle): no problem with almost uniform emission

Δ (triangle): acceptable with partially some non-uniform emission x (cross): unacceptable with non-uniform emission over the entire surface (2.2) Emission Lifetime Each obtained organic EL element was made to continuously emit light at an initial luminance of 5000 $cd/m^2$ with a fixed voltage, and time for the luminance to decrease by half was obtained. An organic EL element was manufactured in the same way as that described above except that the anode electrode was composed of ITO, and a percentage of the above described time to that of this organic EL element was obtained and evaluated according to the following criteria. The evaluation result is shown in TABLE 5. The percentage is preferably 100% or more and far preferably 150% or more.

⊚ (double circle): 150% or more

○ (single circle): 100% or more and less than 150%

Δ (triangle): 80% or more and less than 100% x (cross): less than 80%

TABLE 5

| SAMPLE OF ORGANIC EL ELEMENT | EMISSION UNIFORMITY | | EMISSION LIFETIME | REMARK |
| --- | --- | --- | --- | --- |
| | BEFORE DEGRADATION TEST | AFTER DEGRADATION TEST | | |
| 3-1 | ⊚ | ○ | Δ | EXAMPLE |
| 3-2 | ⊚ | ○ | ○ | |
| 3-3 | ⊚ | ⊚ | ○ | |
| 3-4 | ⊚ | ⊚ | ⊚ | |
| 3-5 | ⊚ | ⊚ | ⊚ | |
| 3-6 | ⊚ | ⊚ | ⊚ | |

TABLE 5-continued

| SAMPLE OF ORGANIC EL ELEMENT | EMISSION UNIFORMITY BEFORE DEGRADATION TEST | EMISSION UNIFORMITY AFTER DEGRADATION TEST | EMISSION LIFETIME | REMARK |
|---|---|---|---|---|
| 3-7 | ⊚ | ⊚ | ⊚ | |
| 3-8 | ⊚ | ⊚ | ⊚ | |
| 3-9 | ⊚ | ○ | △ | |
| 3-10 | ⊚ | ○ | ○ | |
| 3-11 | ⊚ | ○ | ○ | |
| 3-12 | ⊚ | ○ | ○ | |
| 3-13 | ⊚ | ⊚ | ⊚ | |
| 3-14 | ⊚ | ⊚ | ⊚ | |
| 3-15 | ○ | △ | △ | COMPARATIVE EXAMPLE |
| 3-16 | ○ | △ | △ | |
| 3-17 | △ | X | X | |
| 3-18 | △ | X | X | |
| 3-19 | △ | X | X | |
| 3-20 | △ | X | X | |
| 3-21 | ○ | X | X | |
| 3-22 | ○ | X | X | |
| 3-23 | ○ | X | X | |
| 3-24 | ○ | X | X | |
| 3-25 | X | X | X | |
| 3-26 | X | X | X | |
| 3-27 | △ | △ | X | |
| 3-28 | △ | △ | X | |
| 3-29 | ⊚ | ⊚ | ⊚ | EXAMPLE |
| 3-30 | ⊚ | ○ | ○ | |

(3) Conclusion

As shown in TABLE 5, Samples 3-1 to 3-14 and 3-29 to 3-30 of the organic EL elements using the respective transparent electrodes each manufactured with the composition containing a certain self-dispersing polymer, a certain polar solvent and a certain glycol ether maintained the properties between before and after the degradation test and also were excellent in the emission lifetime (durability) as compared with Samples 3-15 to 3-28 as comparative examples.

From this, it is understood that use of the above described composition in manufacturing an organic EL element also prevents performance of the organic EL element itself from degrading in accordance with one or more embodiments of the invention.

INDUSTRIAL APPLICABILITY

Embodiments of the invention are a composition for forming a transparent electrode (conductive polymer layer) which is optimum for inkjet printing and suitable for mass production and can be particularly suitably used to prevent performance of a transparent electrode and/or performance of an organic electronic element from degrading when the composition is used in manufacturing the electrode or the element.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims."

DESCRIPTION OF REFERENCE NUMERALS

1 Transparent Electrode
2 Transparent Substrate
4 Conductive Metal Layer
6 Conductive Polymer Layer
10 Organic EL Element
12 Extraction Electrode
14 Organic Luminescent Layer
16 Counter Electrode
18 Sealing Member

The invention claimed is:

1. A composition for forming a transparent electrode to form a conductive polymer layer on a transparent substrate, the composition comprising:
 a conductive polymer;
 a self-dispersing polymer dispersible in an aqueous solvent;
 water;
 a polar solvent other than water; and
 a glycol ether, wherein
 the self-dispersing polymer is a self-dispersing polymer containing a dissociable group and having a glass transition temperature of 25° C. or more and 80° C. or less,
 the polar solvent is 5% or more and 40% or less of a total weight of the composition, and
 the glycol ether is 5% or more and 30% or less of the total weight of the composition.

2. The composition for forming a transparent electrode according to claim 1, wherein the polar solvent is any of an ethylene glycol, a propylene glycol and a dimethyl sulfoxide.

3. The composition for forming a transparent electrode according to claim 2, wherein the glycol ether is either of an ethylene glycol monoalkyl ether and a propylene glycol monoalkyl ether.

4. The composition for forming a transparent electrode according to claim 1, wherein the glycol ether is either of an ethylene glycol monoalkyl ether and a propylene glycol monoalkyl ether.

5. The composition for forming a transparent electrode according to claim 1, wherein surface smoothness of the conductive polymer layer is Ry≤50 nm and Ra is ≤10 nm, wherein Ry represents maximum height and Ra represents arithmetical mean roughness.

6. The composition for forming a transparent electrode according to claim 1, wherein electric resistance of the conductive polymer layer is, by surface resistivity, 1000Ω/□ or less.

7. The composition for forming a transparent electrode according to claim 1, wherein total luminous transmittance of the transparent electrode is 60% or more.

8. A transparent electrode comprising:
 a transparent substrate; and
 a conductive polymer layer formed on the transparent substrate, wherein
 the conductive polymer layer is formed by discharging the composition for forming a transparent electrode according to claim 1 on the transparent substrate by inkjet printing.

9. The transparent electrode according to claim 8, wherein a conductive metal layer having a predetermined pattern is formed between the transparent substrate and the conductive polymer layer.

10. An organic electronic element comprising:
 the transparent electrode according to claim 9;
 a second electrode disposed opposite to the transparent electrode; and
 an organic functional layer disposed between the transparent electrode and the second electrode.

11. An organic electronic element comprising:
the transparent electrode according to claim 8;
a second electrode disposed opposite to the transparent electrode; and
an organic functional layer disposed between the transparent electrode and the second electrode.

12. The organic electronic element according to claim 11, wherein the organic electronic element is an organic electroluminescent element or an organic solar battery element.

13. A method for manufacturing a transparent electrode having a transparent substrate and a conductive polymer layer formed on the transparent substrate, the method comprising:
a step of mixing: a conductive polymer; a self-dispersing polymer being dispersible in an aqueous solvent, containing a dissociable group and having a grass transition temperature of 25° C. or more and 80° C. or less; water; a polar solvent other than water; and a glycol ether so as to prepare a composition for forming a transparent electrode; and
a step of discharging the composition for forming a transparent electrode on the transparent substrate by inkjet printing so as to form the conductive polymer layer,
wherein the polar solvent is 5% or more and 40% or less of a total weight of the composition, and
wherein the glycol ether is 5% or more and 30% or less of the total weight of the composition.

* * * * *